United States Patent
Mabuchi

(10) Patent No.: US 9,099,373 B2
(45) Date of Patent: *Aug. 4, 2015

(54) SOLID-STATE IMAGING DEVICE, DRIVING METHOD THEREOF, AND ELECTRONIC DEVICE

(71) Applicant: Sony Corporation, Tokyo (JP)

(72) Inventor: Keiji Mabuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/197,967

(22) Filed: Mar. 5, 2014

(65) Prior Publication Data

US 2014/0183604 A1     Jul. 3, 2014

Related U.S. Application Data

(63) Continuation of application No. 13/302,247, filed on Nov. 22, 2011, now Pat. No. 8,686,339.

(30) Foreign Application Priority Data

Nov. 29, 2010   (JP) .................................. 2010-264870

(51) Int. Cl.
  *H01L 27/00* (2006.01)
  *H01L 27/148* (2006.01)
  (Continued)

(52) U.S. Cl.
  CPC .... *H01L 27/14806* (2013.01); *H01L 27/14609* (2013.01); *H04N 5/363* (2013.01); *H04N 5/37452* (2013.01); *H04N 5/37457* (2013.01)

(58) Field of Classification Search
  CPC .................. H01L 27/14601; H01L 27/14609; H01L 27/14612; H01L 27/14643; H04N 5/335; H04N 5/343; H04N 5/355; H04N 3/557; H04N 5/34752

USPC ............ 250/208.1, 214.1; 257/291, 292, 298, 257/443; 348/241, 294, 297, 299, 301, 308, 348/314

See application file for complete search history.

(56) References Cited

U.S. PATENT DOCUMENTS

| | | | |
|---|---|---|---|
| 7,518,143 B2 | 4/2009 | Sugawa | |
| 2005/0052554 A1* | 3/2005 | Sakurai et al. | ............... 348/301 |

(Continued)

FOREIGN PATENT DOCUMENTS

| | | |
|---|---|---|
| JP | 63-067976 | 3/1988 |
| JP | 2001-160925 | 6/2001 |

(Continued)

OTHER PUBLICATIONS

Japanese Office Examination Report issued in connection with related Japanese Patent Application No. JP 2010-264870 dated Aug. 19, 2014.

*Primary Examiner* — Kevin Pyo
(74) *Attorney, Agent, or Firm* — Dentons US LLP

(57) ABSTRACT

A solid-state imaging device including a pixel region in which a plurality of pixels are arranged. The pixels each includes a photoelectric conversion section, a transfer transistor, a plurality of floating diffusion sections receiving a charge from the photoelectric conversion section through the transfer transistor, a reset transistor resetting the floating diffusion sections, a separating transistor performing on-off control of a connection between the plurality of floating diffusion sections, and an amplifying transistor outputting a signal corresponding to a potential of the floating diffusion sections.

24 Claims, 13 Drawing Sheets

(51) Int. Cl.
*H01L 27/146* (2006.01)
*H04N 5/363* (2011.01)
*H04N 5/3745* (2011.01)

(56) References Cited

U.S. PATENT DOCUMENTS

2007/0035649 A1  2/2007  McKee
2007/0132870 A1* 6/2007  Ahn .............................. 348/308

2009/0140305 A1  6/2009  Sugawa
2013/0049083 A1  2/2013  Itonaga et al.

FOREIGN PATENT DOCUMENTS

| | | |
|---|---|---|
| JP | 2007-027601 | 2/2007 |
| JP | 2008-205638 | 9/2008 |
| JP | 2009-044462 | 2/2009 |
| JP | 2009-505498 | 2/2009 |
| WO | WO/2005/083790 | 9/2005 |

* cited by examiner

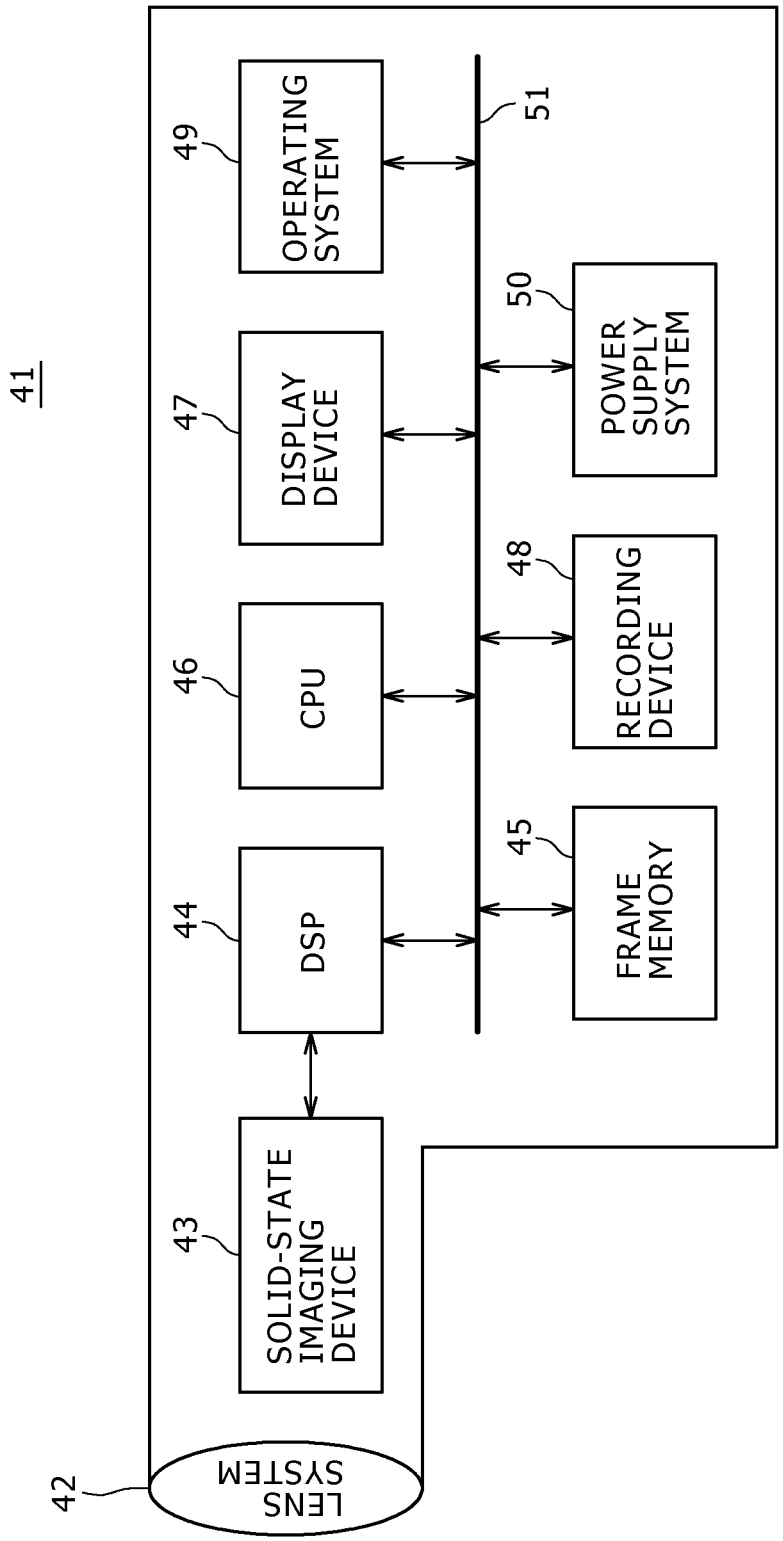

US 9,099,373 B2

SOLID-STATE IMAGING DEVICE, DRIVING METHOD THEREOF, AND ELECTRONIC DEVICE

RELATED APPLICATION DATA

This application is a continuation of U.S. patent application Ser. No. 13/302,247 filed Nov. 22, 2011, the entirety of which is incorporated herein by reference to the extent permitted by law. The present application claims the benefit of priority to Japanese Patent Application No. JP 2010-264870 filed on Nov. 29, 2010 in the Japan Patent Office, the entirety of which is incorporated by reference herein to the extent permitted by law.

BACKGROUND

The present technology relates to a solid-state imaging device, a driving method thereof, and an electronic device such as a camera or the like including the solid-state imaging device.

A CMOS (Complementary Metal Oxide Semiconductor) solid-state imaging device is known as a solid-state imaging device (image sensor). The CMOS solid-state imaging device is used in various portable terminal devices and the like including digital still cameras, digital video cameras, and portable telephones provided with a camera.

Many CMOS solid-state imaging devices known in the past transfer the charge of a photodiode (PD) serving as a photoelectric conversion section to a floating diffusion section (FD), and extract a pixel signal by reading the potential of the floating diffusion section. In this case, when the floating diffusion section has a low capacitance, a gain with which conversion into voltage is made is increased, and subsequent noise appears to be low. Thus, a good S/N is obtained. However, an amount of charge that can be handled is small. Conversely, when the floating diffusion section has a high capacitance, the amount of charge that can be handled is increased, but the S/N is lowered.

A solid-state imaging device in which a floating diffusion section is formed by two capacitances is proposed to solve a tradeoff relation between the amount of charge handled and the S/N. The solid-state imaging device is configured to use a signal (S1) read by one capacitance (FD1) when there is a small amount of charge and use a signal (S2) read by two capacitances (FD1 and FD2) when there is a large amount of charge. Japanese Patent Laid-Open No. Sho 63-67976, JP-T-2009-505498, and PCT Patent Publication No. WO2005/083790 (referred to as Patent Documents 1, 2, and 3, respectively) disclose examples of such solid-state imaging devices in the past.

SUMMARY

Also in cases where these solid-state imaging devices are implemented, as in cases of a single floating diffusion section, differences between the above-described signals S1 and S2 and one or two reset level signals (N) in a state of the capacitances FD1 and FD2 being reset are obtained and set as actual signals. However, driving methods according to the examples in the past have been found to have the following problems.

(1) Reset noise and the like cannot be removed from at least one of the signals S1 and S2 even when the differences are obtained. Alternatively, a frame memory is required.

(2) Limitation is imposed on a circuit for obtaining the differences. That is, provision has to be made for the readout of a reset level signal N and a signal S in reverse order. Original signals should not be destroyed even when differences are obtained.

For example, in Patent Document 1, a photodiode PD doubles as a first floating diffusion section FD. Thus, as in a pixel of a so-called three-transistor type, after signals S1 and S2 are output, the photodiode PD is reset, and a reset level signal N is taken. Even when differences from the reset level signal N are obtained, reset noise remains in both the signals S1 and S2.

Patent Document 2 represents a combination with a pixel of a so-called four-transistor type, in which a photodiode PD and a floating diffusion section FD are separated from each other by a transfer transistor. Thus, as in a pixel of the four-transistor type, reset noise can be removed by obtaining a difference between a signal S1 and a reset level signal N. However, a driving method disclosed in Patent Document 2 cannot remove noise caused by the charge division of a transistor DCG separating two capacitances from each other from a signal S2 even when a difference between the signal S2 and the reset level signal N is obtained. In addition, because the signals appear in order of N, S1, to S2, the difference between the signal S2 and the reset level signal N cannot be obtained unless the reset level signal N is retained without being destroyed even when the difference between the signal S1 and the reset level signal N is obtained. Thus, a limitation is imposed on a usable column processing circuit, or a capacitance occupying a large area for retaining the reset level signal N becomes necessary. That is, when a precaution is to be taken against noise, a capacitance having a large area becomes necessary.

Patent Document 3 represents another example in which a floating diffusion section FD is divided into two parts. This example assumes that a charge is allowed to overflow from a photodiode PD to the floating diffusion section FD at a time of accumulation, so that the charge is buried also in the floating diffusion section FD. In this example, reset noise and a dark current of the floating diffusion section FD an amount of which dark current corresponds to an accumulation period are superimposed on a signal S2. In addition, because signals appear in order of N1, S1, S2, to N2, a column processing circuit has to handle a reset level and a signal level irrespective of the order of appearance of the reset level and the signal level, in which order one of the reset level and the signal level appears first.

In view of the above points, the present technology provides a solid-state imaging device that includes pixels each having a plurality of floating diffusion sections and which can remove reset noise from both a small signal and a large signal in a column processing circuit in such manners as to correspond to the small signal and the large signal, and a driving method of the solid-state imaging device.

The present technology provides an electronic device such as a camera or the like including such a solid-state imaging device.

According to an embodiment of the present disclosure, there is a solid-state imaging device including a pixel region in which a plurality of pixels are arranged. The pixels each may include a photoelectric conversion section, a transfer transistor, a plurality of floating diffusion sections receiving a charge from the photoelectric conversion section through the transfer transistor, a reset transistor resetting the floating diffusion sections, a separating transistor performing on-off control of a connection between the plurality of floating diffusion sections, and an amplifying transistor outputting a signal corresponding to a potential of the floating diffusion sections. The floating diffusion section in a first stage as viewed from the photoelectric conversion section is reset via the reset transistor, and an output of the floating diffusion section in the first stage is taken in by a subsequent stage circuit. A charge is transferred from the photoelectric conversion section through the transfer transistor to the floating diffusion section in the first stage, and an output of the floating diffusion section in the first stage, the floating diffusion section in the first stage including the charge, is taken in by the subsequent stage circuit. The separating transistor is turned on to connect the floating diffusion section in the first stage and the floating diffusion section in a second stage as viewed from the photoelectric conversion section to each other, and an output of the floating diffusion sections connected to each other is taken in by the subsequent stage circuit. A charge is transferred from the photoelectric conversion section through the transfer transistor to the floating diffusion sections connected to each other, and an output of the floating diffusion sections connected to each other, the floating diffusion sections connected to each other including the charge, is taken in by the subsequent stage circuit. A difference between the output of the floating diffusion section in the first stage after the charge is transferred and the output of the reset floating diffusion section in the first stage and a difference between the output of the floating diffusion sections connected to each other, the floating diffusion sections connected to each other including the charge transferred from the photoelectric conversion section, and the output of the floating diffusion sections connected to each other before the charge is transferred are obtained.

The solid-state imaging device according to the above-described embodiment of the present technology can remove reset noise from both a small signal and a large signal in the column processing circuit in such manners as to correspond to the small signal and the large signal.

According to another embodiment of the present technology, there is a driving method of a solid-state imaging device including a pixel region in which a plurality of pixels are arranged, the pixels each including a photoelectric conversion section, a transfer transistor, a plurality of floating diffusion sections receiving a charge from the photoelectric conversion section through the transfer transistor, a reset transistor resetting the floating diffusion sections, a separating transistor performing on-off control of a connection between the plurality of floating diffusion sections, and an amplifying transistor outputting a signal corresponding to a potential of the floating diffusion sections. The driving method include resetting the floating diffusion section in a first stage as viewed from the photoelectric conversion section via the reset transistor, and taking in an output of the floating diffusion section in the first stage by a subsequent stage circuit, transferring a charge from the photoelectric conversion section through the transfer transistor to the floating diffusion section in the first stage, and taking in an output of the floating diffusion section in the first stage, the floating diffusion section in the first stage including the charge, by the subsequent stage circuit, turning on the separating transistor to connect the floating diffusion section in the first stage and the floating diffusion section in a second stage as viewed from the photoelectric conversion section to each other, and taking in an output of the floating diffusion sections connected to each other by the subsequent stage circuit, transferring a charge from the photoelectric conversion section through the transfer transistor to the floating diffusion sections connected to each other, and taking in an output of the floating diffusion sections connected to each other, the floating diffusion sections connected to each other including the charge, by the subsequent stage circuit, and obtaining a difference between the output of the floating diffusion section in the first stage after the charge is transferred and the output of the reset floating diffusion section in the first stage and a difference between the output of the floating diffusion sections connected to each other, the floating diffusion sections connected to each other including the charge transferred from the photoelectric conversion section, and the output of the floating diffusion sections connected to each other before the charge is transferred.

The driving method of the solid-state imaging device according to the above-described embodiment of the present technology can remove reset noise from both a small signal and a large signal in the column circuit in such manners as to correspond to the small signal and the large signal.

According to further embodiment of the present technology, there is provided an electronic device including a solid-state imaging device having a pixel region in which a plurality of pixels are arranged, an optical system guiding incident light to a photoelectric conversion section of the solid-state imaging device, and a signal processing circuit processing an output signal of the solid-state imaging device. In the solid-state imaging device, the pixels each includes a photoelectric conversion section, a transfer transistor, a plurality of floating diffusion sections receiving a charge from the photoelectric conversion section through the transfer transistor, a reset transistor resetting the floating diffusion sections, a separating transistor performing on-off control of a connection between the plurality of floating diffusion sections, and an amplifying transistor outputting a signal corresponding to a potential of the floating diffusion sections. The floating diffusion section in a first stage as viewed from the photoelectric conversion section is reset via the reset transistor, and an output of the floating diffusion section in the first stage is taken in by a subsequent stage circuit. A charge is transferred from the photoelectric conversion section through the transfer transistor to the floating diffusion section in the first stage, and an output of the floating diffusion section in the first stage, the floating diffusion section in the first stage including the charge, is taken in by the subsequent stage circuit. The separating transistor is turned on to connect the floating diffusion section in the first stage and the floating diffusion section in a second stage as viewed from the photoelectric conversion section to each other, and an output of the floating diffusion sections connected to each other is taken in by the subsequent stage circuit. A charge is transferred from the photoelectric conversion section through the transfer transistor to the floating diffusion sections connected to each other, and an output of the floating diffusion sections connected to each other, the floating diffusion sections connected to each other including the charge, is taken in by the subsequent stage circuit. A difference between the output of the floating diffusion section in the first stage after the charge is transferred and the output of the reset floating diffusion section in the first stage and a difference between the output of the floating diffusion sections connected to each other, the floating diffusion sections connected to each other including the charge transferred from the photoelectric conversion section, and the output of the floating diffusion sections connected to each other before the charge is transferred is obtained.

The electronic device according to the above-described embodiment of the present technology includes the above-described solid-state imaging device, and can therefore remove reset noise from both a small signal and a large signal in the column processing circuit in such manners as to correspond to the small signal and the large signal.

According to the solid-state imaging device and the driving method thereof in accordance with the above-described embodiments of the present technology, pixels each having a plurality of floating diffusion sections are provided, and reset noise can be removed from both a small signal and a large signal in the column processing circuit in such manners as to correspond to the small signal and the large signal. Thus, image quality can be improved.

According to the electronic device in accordance with the above-described embodiment of the present technology, the above-described solid-state imaging device can remove reset noise from both a small signal and a large signal in the column processing circuit in such manners as to correspond to the small signal and the large signal. Thus, image quality is improved, and high-quality electronic devices can be provided.

BRIEF DESCRIPTION OF THE DRAWINGS

FIG. 16 is a schematic block diagram showing an electronic device according to a sixth embodiment of the present technology.

DETAILED DESCRIPTION OF THE PREFERRED EMBODIMENTS

The mode for carrying out the technology (which mode will hereinafter be referred to as embodiments) will hereinafter be described. Incidentally, description will be made in the following order.

1. Example of Schematic Configuration of CMOS Solid-State Imaging Device
2. First Embodiment (Example of Configuration of Solid-State Imaging Device and Driving Method Thereof)
3. Second Embodiment (Example of Configuration of Solid-State Imaging Device and Driving Method Thereof)
4. Third Embodiment (Example of Configuration of Solid-State Imaging Device and Driving Method Thereof)
5. Fourth Embodiment (Example of Configuration of Solid-State Imaging Device and Driving Method Thereof)
6. Fifth Embodiment (Example of Configuration of Solid-State Imaging Device and Driving Method Thereof)
7. Sixth Embodiment (Example of Configuration of Electronic Device)

<1. Example of Schematic Configuration of CMOS Solid-State Imaging Device>

Figure 1:
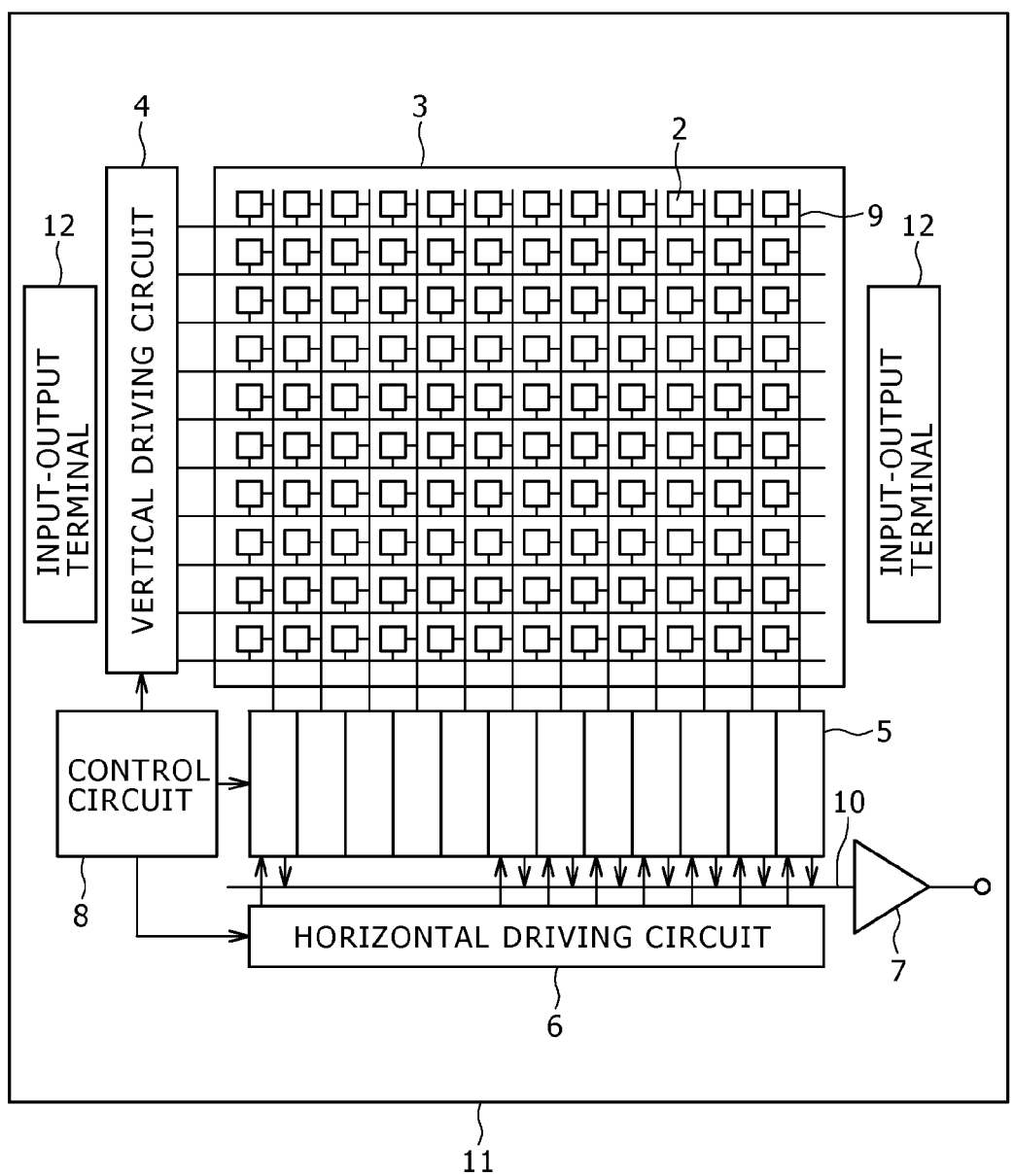
FIG. 1 is a schematic block diagram showing an example of a CMOS solid-state imaging device.

FIG. 1 shows a schematic configuration of an example of a CMOS solid-state imaging device applied to an embodiment of the present technology. The CMOS solid-state imaging device in the present example includes a pixel region 3 in which a plurality of pixels 2 including a photoelectric conversion section are regularly arranged in the form of a two-dimensional matrix on a semiconductor substrate 11, for example a silicon substrate, and a peripheral circuit section. As will be described later, unit pixels each including one photoelectric conversion section, a plurality of floating diffusion sections, and a plurality of pixel transistors can be applied as the pixels 2. In addition, a so-called pixel sharing structure in which a plurality of floating diffusion sections and a plurality of photoelectric conversion sections share pixel transistors other than transfer transistors can be applied to the pixels 2. A plurality of pixel transistors can be of a configuration formed by further adding a separating transistor to four transistors, that is, a transfer transistor, a reset transistor, an amplifying transistor, and a selecting transistor. Alternatively, a plurality of pixel transistors can be of a configuration formed by further adding a separating transistor to three transistors with a selecting transistor omitted.

The peripheral circuit section includes so-called analog circuits and logic circuits such as a vertical driving circuit 4, a column processing circuit 5, a horizontal driving circuit 6, an output circuit 7, a control circuit 8, and the like.

The control circuit 8 receives an input clock and data indicating an operation mode and the like, and outputs data such as internal information of the solid-state imaging device and the like. Further, the control circuit 8 generates a clock signal and a control signal serving as a reference for the operation of the vertical driving circuit 4, the column processing circuit 5, the horizontal driving circuit 6, and the like on the basis of a vertical synchronizing signal, a horizontal synchronizing signal, and a master clock. The control circuit 8 then inputs these signals to the vertical driving circuit 4, the column processing circuit 5, the horizontal driving circuit 6, and the like.

The vertical driving circuit 4 is formed by a shift register, for example. The vertical driving circuit 4 selects a pixel driving wiring, applies a pulse for driving pixels to the selected pixel driving wiring, and thereby drives the pixels in a row unit. Specifically, the vertical driving circuit 4 sequentially selects and scans each pixel 2 of the pixel region 3 in row units in a vertical direction. Then, a pixel signal based on a signal charge generated according to an amount of light received in for example a photodiode serving as a photoelectric conversion element of each pixel 2 is applied to the column processing circuit 5 via a vertical signal line 9.

The column processing circuit 5 is arranged for example for each column of the pixels 2. The column processing circuit 5 receives image signals output from pixels 2 of one row, obtains a difference between a signal level and a reset level for each pixel column, and performs signal processing such as noise removal and the like. Specifically, the column processing circuit 5 performs signal processing such as CDS (Correlated Double Sampling) for removing fixed pattern noise unique to the pixels 2, signal amplification, AD (Analog-to Digital) conversion, and the like. A horizontal selecting switch (not shown) is provided so as to be connected between an output stage of the column processing circuit 5 and a horizontal signal line 10.

The horizontal driving circuit 6 is formed by a shift register, for example. The horizontal driving circuit 6 selects each part of the column processing circuit 5 in order by sequentially outputting a horizontal scanning pulse, and makes a pixel signal output from each part of the column processing circuit 5 to the horizontal signal line 10.

The output circuit 7 subjects the image signal sequentially applied from each part of the column processing circuit 5 to the output circuit 7 through the horizontal signal line 10 to signal processing such as gain adjustment, flaw correction, and the like, and then outputs a resulting image signal. For example, the output circuit 7 may perform only buffering, or may perform black level adjustment, column variation correction, various digital signal processing, and the like. An input-output terminal 12 exchanges signals with the outside.

<2. First Embodiment>
[Example of Configuration of Solid-State Imaging Device]

A first embodiment of a solid-state imaging device according to the present technology has a pixel region in which a plurality of pixels are arranged in the form of a two-dimensional matrix, and each of the pixels has the following elements. Each of the pixels includes a photodiode PD serving as a storing section for detecting a physical quantity and storing a charge corresponding to the physical quantity, that is, a photoelectric conversion section, and a transfer transistor for transferring the charge from the photodiode PD. In addition, each of the pixels includes a plurality of detecting sections for receiving the charge from the photodiode PD through the transfer transistor, that is, a plurality of floating diffusion sections FD, and a reset transistor for resetting the floating diffusion sections FD. Further, each of the pixels includes a separating transistor for performing on-off control of connection between the plurality of floating diffusion sections FD and an amplifying transistor for outputting signals corresponding to the potentials of the floating diffusion sections FD.

Figure 2:
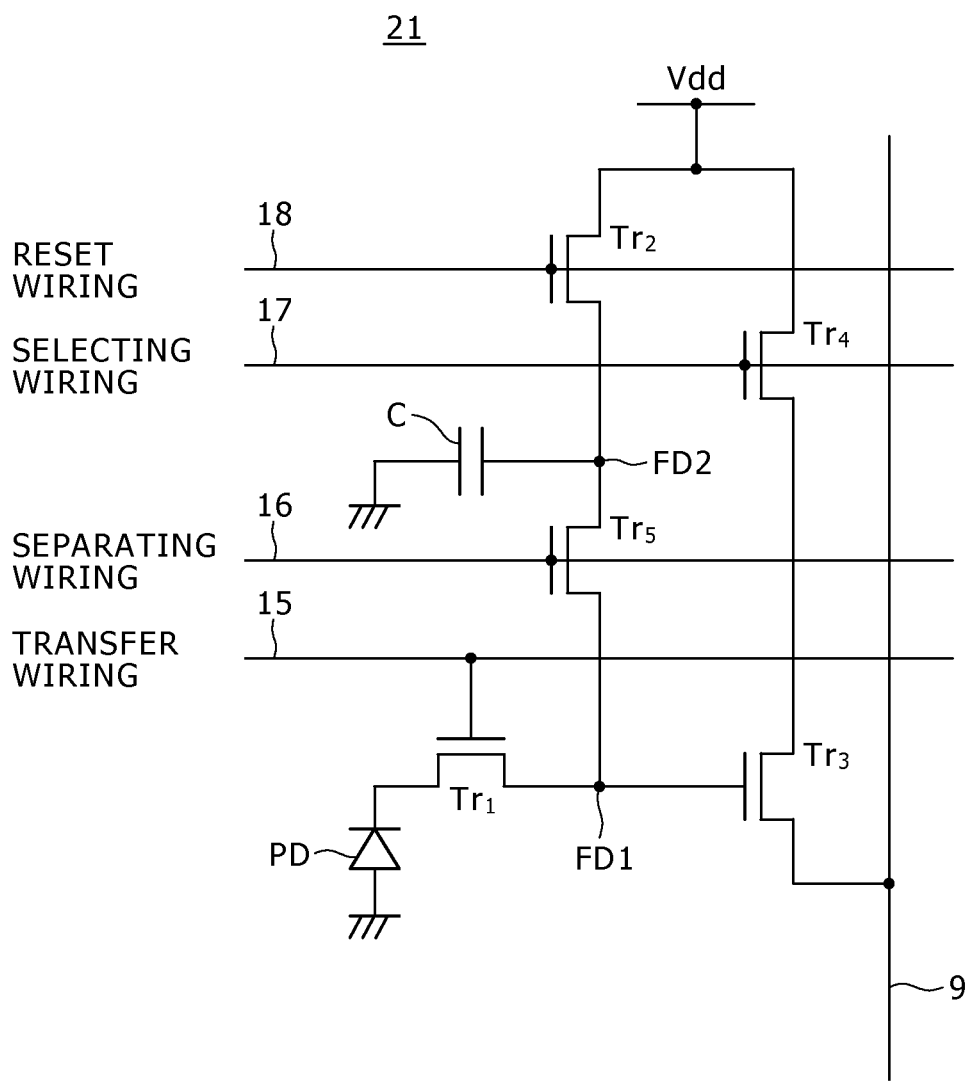
FIG. 2 is an equivalent circuit diagram of a pixel representing a first embodiment of a solid-state imaging device according to an embodiment of the present technology.

FIG. 2 shows an equivalent circuit of a pixel in the solid-state imaging device according to the first embodiment. The present embodiment includes two floating diffusion sections FD1 and FD2. A pixel 21 includes one photodiode PD, one transfer transistor Tr1, one reset transistor Tr2, one amplifying transistor Tr3, one selecting transistor Tr4, one separating transistor Tr5, and the two floating diffusion sections FD1 and FD2.

Specifically, the photodiode PD is connected to the first floating diffusion section FD1 via the transfer transistor Tr1. The first floating diffusion section FD1 is connected to the gate of the amplifying transistor Tr3, and is connected to the second floating diffusion section FD2 via the separating transistor Tr5. The second floating diffusion section FD2 is connected to the reset transistor Tr2, and is connected to a capacitance element C. Another terminal of the capacitance element C is grounded. In this example, the second floating diffusion section FD2 gains a total capacitance by not only a parasitic capacitance but also the capacitance element C. The capacitance element C may for example be formed by polysilicon or the like, or it may suffice in another example only to use a parasitic capacitance in a diffusion layer without clearly forming the capacitance element C. As an example, the capacitance element C may be formed by a structure of a polysilicon film, a gate oxide film, and a Si substrate, or may be formed by a structure of a polysilicon film in a first layer, an interlayer film of SiN or the like, and a polysilicon film in a second layer. The amplifying transistor Tr3 has a drain thereof connected to the selecting transistor Tr4, and has a source thereof connected to a vertical signal line 9. Further, the respective drains of the reset transistor Tr2 and the selecting transistor Tr4 are connected to a power supply Vdd.

For ideal readout of a small signal and a large signal, the second floating diffusion section FD2 desirably has a capacitance about twice to 20 times that of the first floating diffusion section FD1. Then, the capacitance of the second floating diffusion section FD2 is desirably to such a degree as to receive exactly the saturation charge of the photodiode PD. When the second floating diffusion section FD2 has too low a capacitance, there is a small difference in gain between a signal S1 and a signal S2, and effect is reduced. When the second floating diffusion section FD2 has too high a capacitance, the signal S2 covers almost all of a signal range, so that the signal S1 is not very meaningful.

The gate of the transfer transistor Tr1 is connected to transfer wiring 15. The gate of the separating transistor Tr5 is connected to a separating wiring 16. The gate of the selecting transistor Tr4 is connected to a selecting wiring 17. The gate of the reset transistor Tr2 is connected to a reset wiring 18.

In the above-described pixel 21, when the selecting transistor Tr4 is in an on state, the amplifying transistor Tr3 outputs a signal corresponding to the potential of the first floating diffusion section FD1 to the vertical signal line 9. In addition, when the separating transistor Tr5 is in an on state, the amplifying transistor Tr3 outputs a signal corresponding to the potential of the first and second floating diffusion sections FD1 and FD2 connected to each other to the vertical signal line 9. This vertical signal line 9 is connected to the column processing circuit as a subsequent stage circuit, as described above, and the signals output to the vertical signal line 9 are taken into the column processing circuit. The reset transistor Tr2 resets the first and second floating diffusion sections FD1 and FD2 by discharging the charges of the first and second floating diffusion sections FD1 and FD2 into the power supply Vdd, that is, a power supply wiring.

The solid-state imaging device according to the present embodiment is configured to perform driving by a driving method to be described in the following.

[Driving Method]

Figure 3:
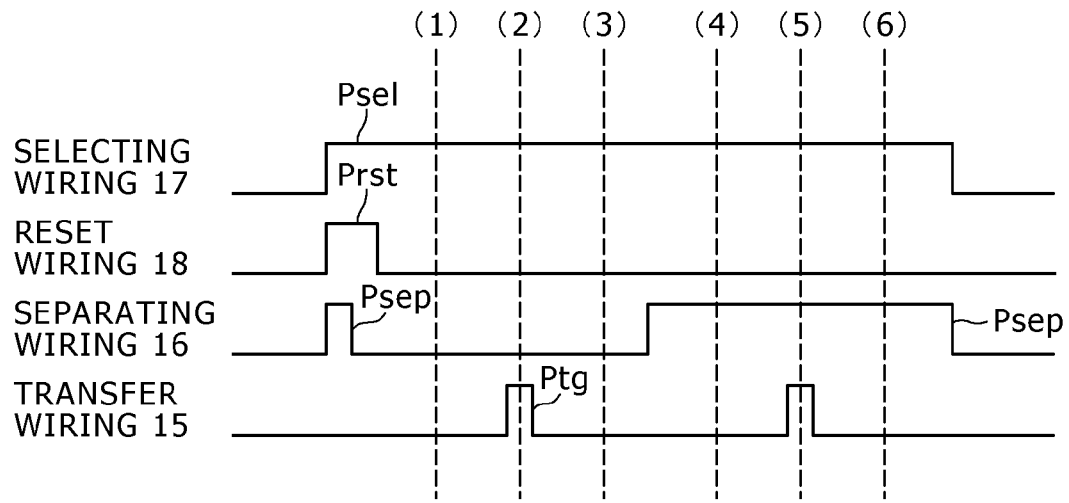
FIG. 3 is a driving timing waveform chart of a driving method of the solid-state imaging device according to the first embodiment.
Figure 4:
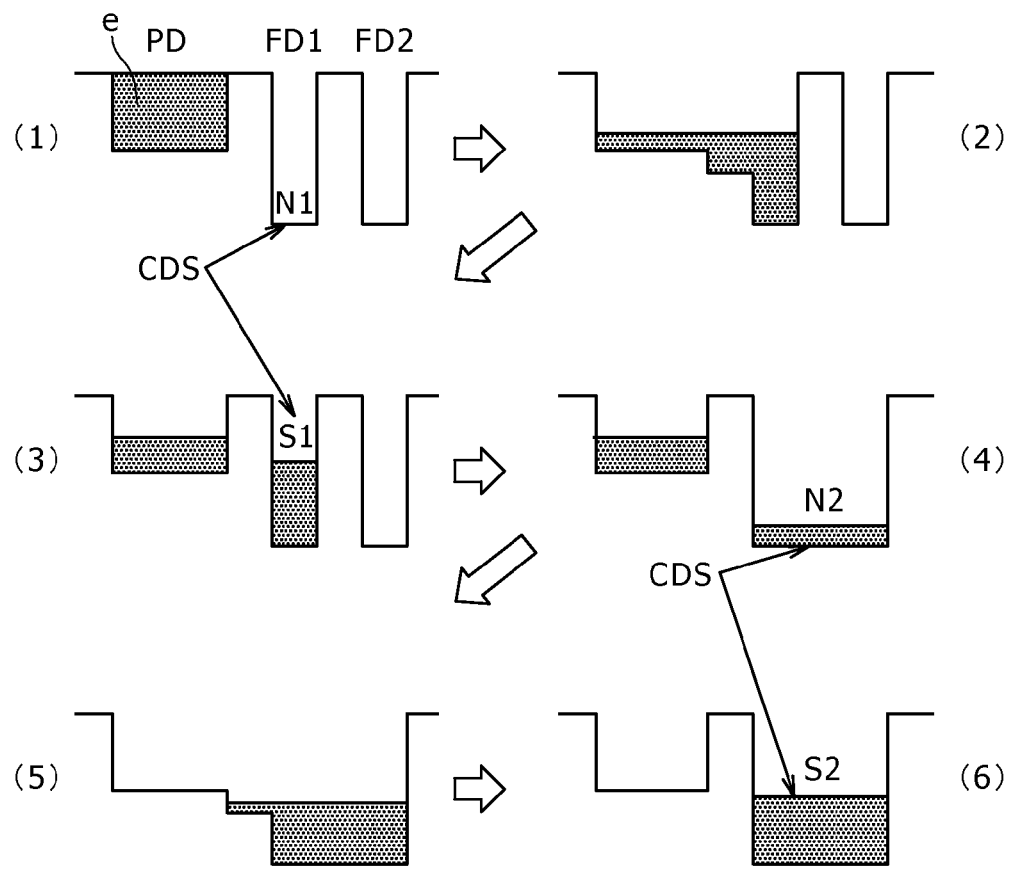
FIG. 4 is a diagram of potentials during the driving of the solid-state imaging device according to the first embodiment.

FIG. 3 and FIG. 4 show the driving method of the solid-state imaging device according to the first embodiment. FIG. 3 shows driving timing when the pixel 21 is read. FIG. 4 shows potentials at the time of driving. The solid-state imaging device according to the present embodiment uses electrons as a signal charge. Suppose that a large amount of charge (electrons) e is accumulated in the photodiode PD before the pixel is read (see FIG. 4(1)).

As shown in FIG. 3, a selecting pulse Psel is applied through the selecting wiring 17 to turn on the selecting transistor Tr4, whereby the pixel is selected. In this state, a reset pulse Prst and a separating pulse Psep are applied to the reset wiring 18 and the separating wiring 16 to turn on the reset transistor Tr2 and the separating transistor Tr5, respectively, whereby the floating diffusion sections FD1 and FD2 are reset. The reset transistor Tr2 and the separating transistor Tr5 are turned off, whereby a state at time point (1) in FIG. 3 and in FIG. 4(1) is obtained. A reset level signal being output to the vertical signal line 9 through the amplifying transistor Tr3 at this time is taken as N1 into the column processing circuit.

Next, at time point (2) in FIG. 3, a transfer pulse Ptg is applied to the transfer transistor Tr1 through the transfer wiring 15 to turn on the transfer transistor Tr1, whereby the charge e is transferred from the photodiode PD to the first floating diffusion section FD1. At this time, when there is a large amount of charge e, the charge e also remains on the side of the photodiode PD (see FIG. 4(2)).

Next, as shown at time point (3) in FIG. 3, the transfer transistor Tr1 is turned off. At this time point (3), the charge e is stored in the first floating diffusion section FD1 (see FIG. 4(3)). The signal of the first floating diffusion section FD1 which signal is being output to the vertical signal line 9 through the amplifying transistor Tr3 at this time is taken as S1 into the column processing circuit.

Because a signal obtained from the charge is superimposed on the signal N1 to form the signal S1, a signal from which reset noise and the like are removed can be obtained by determining a difference between the signal S1 and the signal N1 by the CDS processing of the column processing circuit.

When the photodiode PD has a large amount of charge e, as shown in FIG. 4(3), the charge e remains on the side of the photodiode PD. When the photodiode PD has a small amount of charge e, the charge e does not remain on the side of the photodiode PD, but is completely transferred to the first floating diffusion section FD1. The signal S1 is obtained as a correct signal when there is a small amount of charge e. This signal is a high-gain signal because only the first floating diffusion section FD1 is used.

Next, as shown at time point (4) in FIG. 3, a separating pulse Psep is applied through the separating wiring 16 to turn on the separating transistor Tr5, whereby the first and second floating diffusion sections FD1 and FD2 are connected to each other. The signal S1 of the first floating diffusion section FD1 is stored over the first and second floating diffusion sections FD1 and FD2 connected to each other (see FIG. 4(4)). The signal being output to the vertical signal line 9 through the amplifying transistor Tr3 at this time is taken as N2 into the column processing circuit.

Next, as shown at time point (5) in FIG. 3, a transfer pulse Ptg is applied again to turn on the transfer transistor Tr1, whereby the charge e remaining in the photodiode PD is transferred to the first and second floating diffusion sections FD1 and FD2 connected to each other. At this time, the first floating diffusion section FD1 and the second floating diffusion section FD2 are connected to each other to have a high capacitance, and therefore the charge e does not remain in the photodiode PD (see FIG. 4(5)).

Next, at time point (6) in FIG. 3, the transfer transistor Tr1 is turned off. At this time point (6), the charge e is stored in the first and second floating diffusion sections FD1 and FD2 connected to each other (see FIG. 4(6)). The signal being output to the vertical signal line 9 through the amplifying transistor Tr3 at this time is taken as S2 into the column processing circuit.

Because a signal obtained from the charge is superimposed on the signal N2 to form the signal S2, a signal from which reset noise and the like are removed can be obtained by determining a difference between the signal S2 and the signal N2 by the CDS processing of the column processing circuit. This signal is obtained as a correct signal whether the amount of remaining charge e is large or whether the amount of remaining charge e is small. However, this signal is a low-gain signal.

Next, a signal obtained as the difference between the signal S1 and the signal N1 and a signal obtained as the difference between the signal S2 and the signal N2 are added together with input converted gains made uniform in the output section. Making the input converted gains uniform in this case means the application of different gains to the two difference signals in the output section so that same signal values are obtained for same numbers of photoelectrons. The process of making the input converted gains uniform and adding together the two difference signals may be performed on analog signals or may be performed on digital signals after AD conversion. In addition, this process can also be performed in the column circuit section or the outside of the solid-state imaging device rather than the output section.

When the difference signal between the signal S1 and the signal N1 is a small signal smaller than a certain value, the difference signal between the signal S1 and the signal N1 is used. When the difference signal between the signal S1 and the signal N1 is not smaller than the certain value, or is a large signal, the signal obtained by adding together the difference signal between the signal S1 and the signal N1 and the difference signal between the signal S2 and the signal N2 is used. Thereby, a dark part can be photographed clearly with a high gain, and a bright part can be photographed with a low gain without overexposure occurring easily.

Even in the case of a small signal, it is desirable to perform readout twice even when the charge e of the photodiode PD is reduced to zero by a first readout of the difference signal between the signal S1 and the signal N1, and use the difference signal between the signal S1 and the signal N1.

According to the solid-state imaging device and the driving method thereof according to the first embodiment, the floating diffusion section FD is divided into two floating diffusion sections FD1 and FD2, and a high-gain signal and a low-gain signal are output. In this case, both the signals are output in order of a reset level signal to a signal obtained by superimposing a signal charge on the reset level signal. That is, the signals are output in order of N1, S1, N2, to S2. Thus, both the signals can be subjected to CDS processing in the column processing circuit, so that reset noise and the like can be removed.

There is little limitation imposed on the column processing circuit because for example the column processing circuit of an ordinary CMOS solid-state imaging device can be used as the column processing circuit according to the present embodiment. That is, provision for the column processing circuit according to the present embodiment can be made by an ordinary column processing circuit that is compatible with currently mainstream pixels in which a floating diffusion section is not divided and which circuit obtains a difference signal between signals output in order of N to S.

In the present embodiment, two signal sets are output, and therefore two pieces of the column processing circuit may be disposed so as to correspond to one pixel column. Alternatively, one piece of the column processing circuit may be disposed so as to correspond to one pixel column, and the one piece of the column processing circuit may be used twice. Because it is not necessary to retain a signal N when obtaining a difference, a separate sample-hold capacitance occupying a large area to retain a reset level does not need to be provided. Incidentally, when a separate capacitance for retaining a reset level is to be provided, a capacitance having a large area is necessary to take a precaution against noise.

<3. Second Embodiment>
[Example of Configuration of Solid-State Imaging Device]

A second embodiment of the solid-state imaging device according to the present technology has a pixel region and pixels (including equivalent circuits) similar to those described in the foregoing first embodiment. Therefore, detailed description of the pixel region and the pixels will be omitted. The solid-state imaging device according to the present embodiment is configured to perform driving by a driving method to be described in the following.

[Driving Method]

Figure 5:
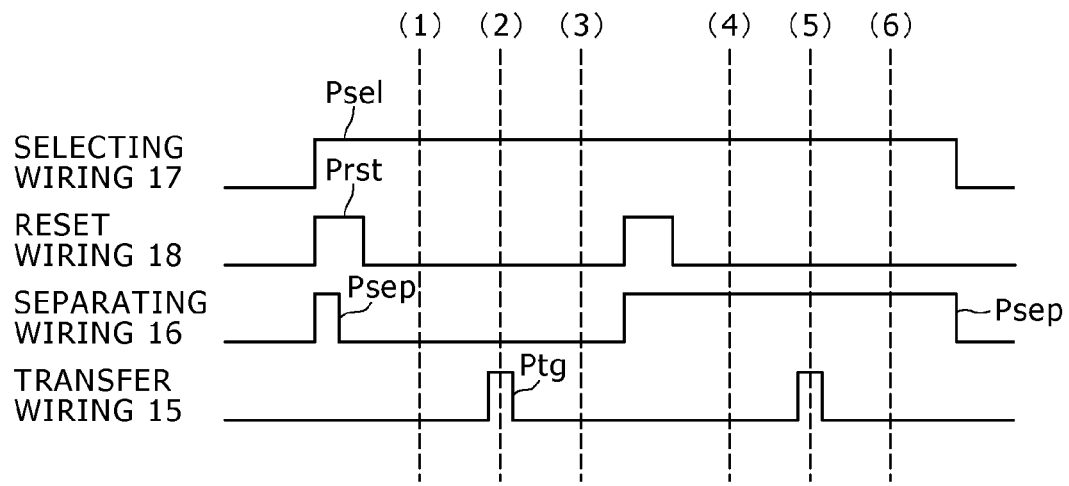
FIG. 5 is a driving timing waveform chart of a second embodiment of a solid-state imaging device according to the present technology.
Figure 6:
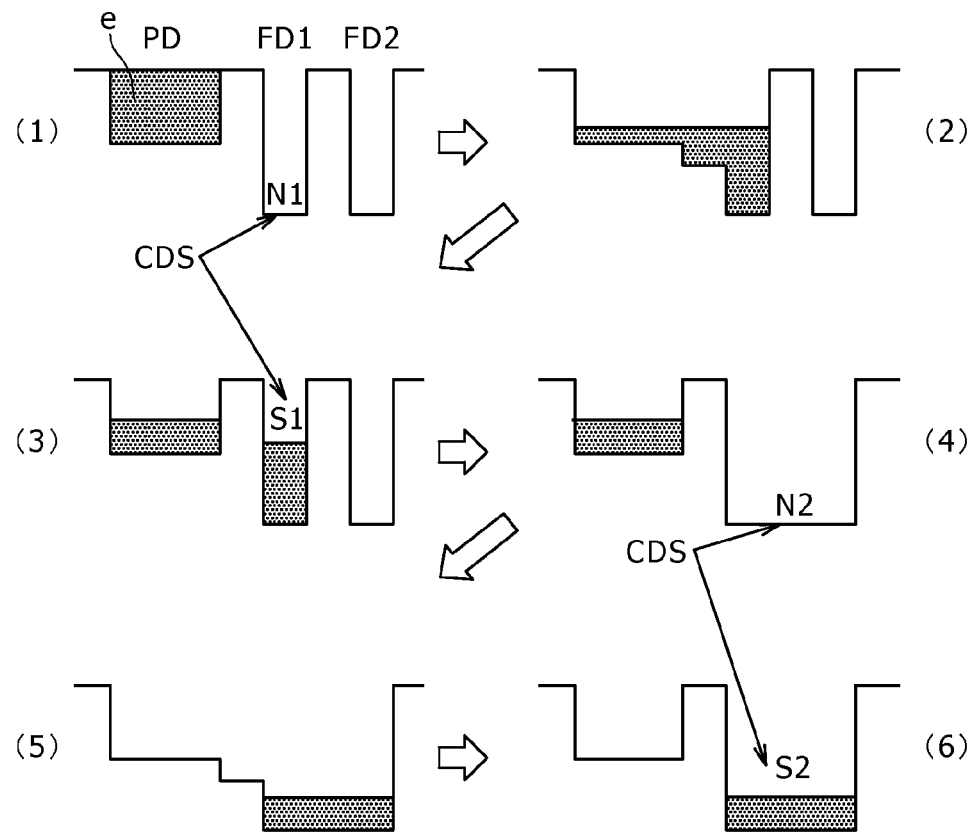
FIG. 6 is a driving timing waveform chart of a driving method of the solid-state imaging device according to the second embodiment.

FIG. 5 and FIG. 6 show the driving method of the solid-state imaging device according to the second embodiment. FIG. 5 shows driving timing when a pixel 21 is read. FIG. 6 shows potentials at the time of driving. The solid-state imaging device according to the present embodiment uses electrons as a signal charge. Suppose that a large amount of charge (electrons) e is accumulated in a photodiode PD before the pixel is read (see FIG. 6(1)).

The driving method according to the present embodiment is different from the first embodiment in that a second reset pulse Prst is applied between time point (3) and time point (4), as shown in FIG. 5. Other timing waveforms are the same as in the first embodiment.

Specifically, as shown in FIG. 5, a selecting pulse Psel is applied through the selecting wiring 17 to turn on a selecting transistor Tr4, whereby the pixel is selected. In this state, a reset pulse Prst and a separating pulse Psep are applied to the reset wiring 18 and separating wiring 16 to turn on a reset transistor Tr2 and a separating transistor Tr5, respectively, whereby floating diffusion sections FD1 and FD2 are reset. A state at time point (1) in FIG. 5 and in FIG. 6(1) is obtained. A signal being output to a vertical signal line 9 through an amplifying transistor Tr3 at this time is taken as N1 into a column processing circuit.

Next, at time point (2) in FIG. 5, a transfer pulse Ptg is applied to a transfer transistor Tr1 through transfer wiring 15 to turn on the transfer transistor Tr1, whereby the charge e is transferred from the photodiode PD to the first floating diffusion section FD1. At this time, when there is a large amount of charge e, the charge e also remains on the side of the photodiode PD (see FIG. 6(2)).

Next, as shown at time point (3) in FIG. 5, the transfer transistor Tr1 is turned off. At this time point (3), the charge e is stored in the first floating diffusion section FD1 (see FIG. 6(3)). The signal of the first floating diffusion section FD1 which signal is being output to the vertical signal line 9 through the amplifying transistor Tr3 at this time is taken as S1 into the column processing circuit.

The CDS processing of the column processing circuit provides a difference between the signal S1 and the signal N1, and thereby provides a signal from which reset noise is removed. In the case of FIG. 6, there is a large amount of charge e in the photodiode PD. Thus the charge e remains in the photodiode PD in FIG. 6(3).

The process up to this point is similar to the first embodiment.

Next, a reset pulse Prst is applied between time point (3) and time point (4) in FIG. 5 to remove the signal S1 of the first floating diffusion section FD1, whereby the first floating diffusion section FD1 is reset. At the same time, a separating pulse Psep is applied to turn on the separating transistor Tr5, whereby the first and second floating diffusion sections FD1 and FD2 are connected to each other (see FIG. 6(4)). At this time, the signal of the first and second floating diffusion sections FD1 and FD2 connected to each other is set as N2, output to the vertical signal line 9 through the amplifying transistor Tr3, and taken into the column processing circuit. The signal N2 corresponds to the reset level signal of the first and second floating diffusion sections FD1 and FD2 connected to each other.

Next, as shown at time point (5) in FIG. 5, a transfer pulse Ptg is applied to turn on the transfer transistor Tr1, whereby the charge e remaining in the photodiode PD is transferred to the first and second floating diffusion sections FD1 and FD2 connected to each other (see FIG. 6(5)).

Next, at time point (6) in FIG. 5, the transfer transistor Tr1 is turned off. At this time, the signal of the first and second floating diffusion sections FD1 and FD2 connected to each other is set as S2 (see FIG. 6(6)), output to the vertical signal line 9 through the amplifying transistor Tr3, and taken into the column processing circuit. The signal S2 corresponds to a signal obtained by adding the signal charge e to the signal N2.

Then, the CDS processing of the column processing circuit provides a difference between the signal S2 and the signal N2, and thereby provides a signal from which reset noise is removed. Thereafter, an output circuit adds a signal as a difference between the signal S1 and the signal N1 to a signal as a difference between the signal S2 and the signal N2 while making input converted gains uniform.

According to the solid-state imaging device and the driving method thereof according to the second embodiment, the signal charge S1 is discarded by the application of the reset pulse Pret between time point (3) and time point (4) in FIG. 5, and the remaining signal becomes the signal S2. When the signal as the difference between the signal S1 and the signal N1 is smaller than a certain value, this difference signal is used as it is. Otherwise, the difference signal between the signal S2 and the signal N2 is added to the difference signal between the signal S1 and the signal N1 with the input converted gains made uniform. Thereby effects similar to those of the first embodiment can be obtained.

Unlike the first embodiment, the second embodiment removes the signal S1. It therefore suffices for the second floating diffusion section FD2 to have a low capacitance. In addition, the second embodiment has an advantage in that for example it suffices to design the output range of the vertical signal line to be narrow because the level of the signal N2 is constant each time.

[Example of Modification of Pixel Equivalent Circuit]

Figure 7:
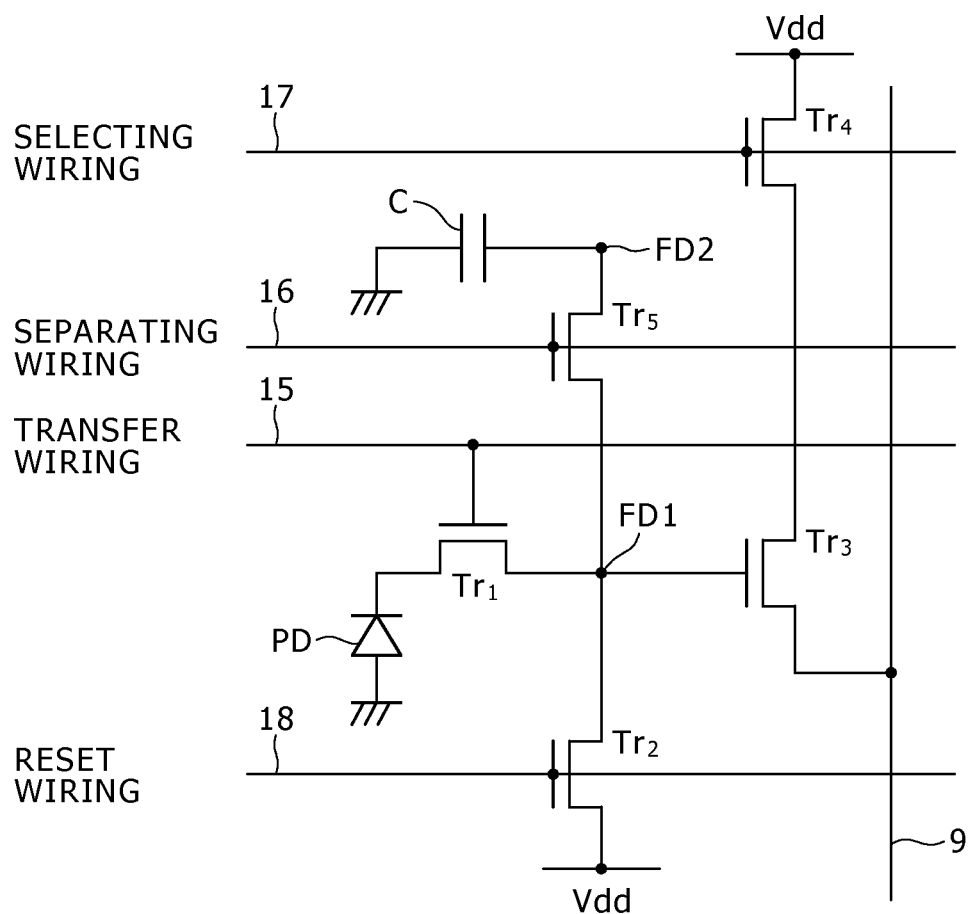
FIG. 7 is an equivalent circuit diagram of an example of modification of a pixel in a solid-state imaging device according to an embodiment of the present technology.

FIG. 7 shows an example of modification of the equivalent circuit of a pixel in the first embodiment and the second embodiment. The equivalent circuit of a pixel in the present example has a reset transistor Tr2 connected to the side of a first floating diffusion section FD1. While two power supplies Vdd are provided in FIG. 7, the power supply Vdd connected to the reset transistor Tr2 on a lower side is identical with the power supply Vdd connected to a selecting transistor Tr4 in the pixel equivalent circuit, so that there is effectively one power supply Vdd. The constitution of other parts is similar to that of FIG. 2, and therefore repeated description thereof will be omitted.

A solid-state imaging device including pixels each composed of this equivalent circuit adopts a driving method similar to that described in the first embodiment and the second embodiment including the pixels each composed of the equivalent circuit of FIG. 2, and produces similar effects to those described in the first embodiment and the second embodiment.

<4. Third Embodiment>

[Example of Configuration of Solid-State Imaging Device]

Figure 8:
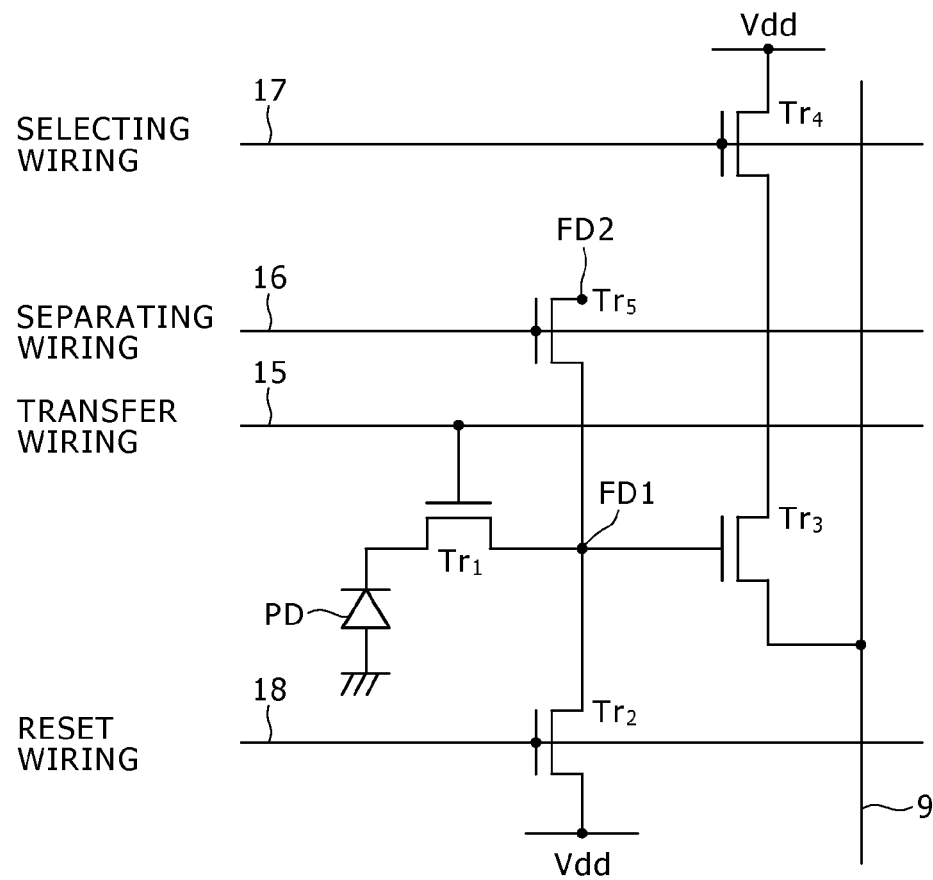
FIG. 8 is an equivalent circuit diagram of a pixel representing a third embodiment of a solid-state imaging device according to the present technology.
Figure 9:
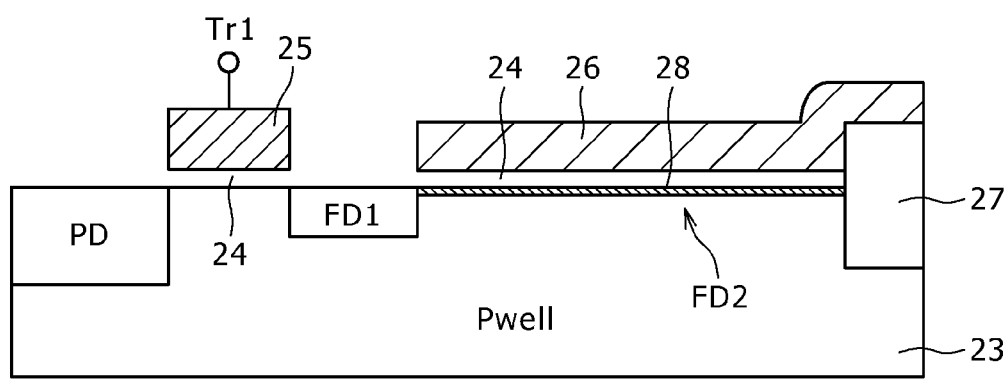
FIG. 9 is a schematic sectional view of parts including a photodiode, a first floating diffusion section, and a second floating diffusion section according to the third embodiment.

A third embodiment of the solid-state imaging device according to the present technology will be described. FIG. 8 shows an equivalent circuit of a pixel according to the present embodiment. This equivalent circuit is formed with a reset transistor Tr2 connected to the side of a first floating diffusion section FD1 and with the drain region of a separating transistor Tr5 omitted. FIG. 9 shows a schematic sectional structure of the first floating diffusion section FD1, the separating transistor Tr5, and a second floating diffusion section FD2. A photodiode PD and the first floating diffusion section FD1 made of an n-type semiconductor region are formed on a semiconductor well region (silicon) 23 of a first conductivity type, for example a p-type. A transfer gate electrode 25 is formed on a gate insulating film 24 between the photodiode PD and the first floating diffusion section FD1, and a transfer transistor Tr1 is formed at the transfer gate electrode 25. On the other hand, with the first floating diffusion section FD1 as a source, a separating gate electrode 26 of the separating transistor Tr5 is formed on the gate insulating film 24 on the surface of the semiconductor well region 23. An element isolation region 27 made of an insulating film is formed in a part corresponding to a drain side, and a semiconductor region to serve as a drain is not formed.

The constitution of other parts in the equivalent circuit of FIG. 8 is similar to that of FIG. 7. Thus, the corresponding parts are identified by the same reference numerals, and repeated description thereof will be omitted.

As shown in FIG. 9, when a high-level separating pulse Psep is applied to the separating gate electrode 26, an inversion layer 28 is formed in the surface of the p-type semiconductor well region 23 under the separating gate electrode 26. This inversion layer 28 acts as the second floating diffusion section FD2.

[Driving Method]

Figure 10:
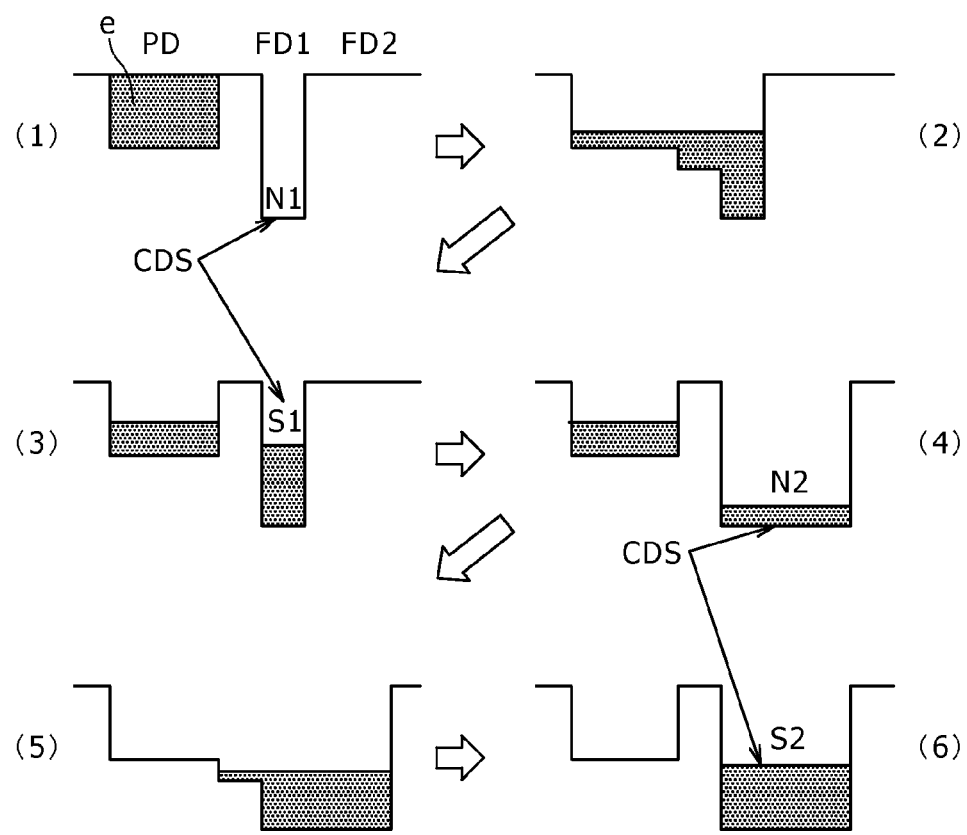
FIG. 10 is a diagram of potentials during the driving of the solid-state imaging device according to the third embodiment.

FIG. 10 shows the potentials of respective regions during operation. The operation is basically similar to that described with reference to FIG. 4. First, as shown in FIG. 10(1), in a state of the pixel being selected with a selecting transistor Tr4 on, the reset transistor Tr2 is turned on to reset the first floating diffusion section FD1. A reset level signal N1 at this time is output to a vertical signal line 9 and taken into a column processing circuit.

Next, as shown in FIG. 10(2), the transfer transistor Tr1 is turned on to transfer the charge e of the photodiode PD to the first floating diffusion section FD1.

Next, as shown in FIG. 10(3), the transfer transistor Tr1 is turned off. The signal of the first floating diffusion section FD1 at this time is set as S1, output to the vertical signal line 9, and taken into the column processing circuit. Then, the CDS processing of the column processing circuit provides a difference between the signal S1 and the signal N1, and provides a signal from which reset noise is removed.

Next, as shown in FIG. 10(4), a separating pulse Psep is applied to the separating gate electrode 26, whereby the second floating diffusion section FD2 is formed by the inversion layer 28. This second floating diffusion section FD2 is connected to the first floating diffusion section FD1. The signal S1 is therefore stored over the first and second floating diffusion sections FD1 and FD2 connected to each other. The signal of the first and second floating diffusion sections FD1 and FD2 connected to each other is set as N2, output to the vertical signal line 9, and taken into the column processing circuit.

Next, as shown in FIG. 10(5), the transfer transistor Tr1 is turned on to transfer the remaining charge e of the photodiode PD to the first and second floating diffusion sections FD1 and FD2 connected to each other.

Next, as shown in FIG. 10(6), the transfer transistor Tr1 is turned off. At this time, the signal of the first and second floating diffusion sections FD1 and FD2 connected to each other is set as S2, output to the vertical signal line 9, and taken into the column processing circuit. The CDS processing of the column processing circuit provides a difference between the signal S2 and the signal N2, and provides a signal from which reset noise and the like are removed.

Next, an output section adds the signal obtained as the difference between the signal S1 and the signal N1 to the signal obtained as the difference between the signal S2 and the signal N2 with input converted gains made uniform.

In the present embodiment, the separating transistor Tr5 and the second floating diffusion section FD2 are formed integrally with each other.

The solid-state imaging device and the driving method thereof according to the third embodiment produce similar effects to those of the first embodiment.

<5. Fourth Embodiment>

[Example of Configuration of Solid-State Imaging Device]

Figure 11:
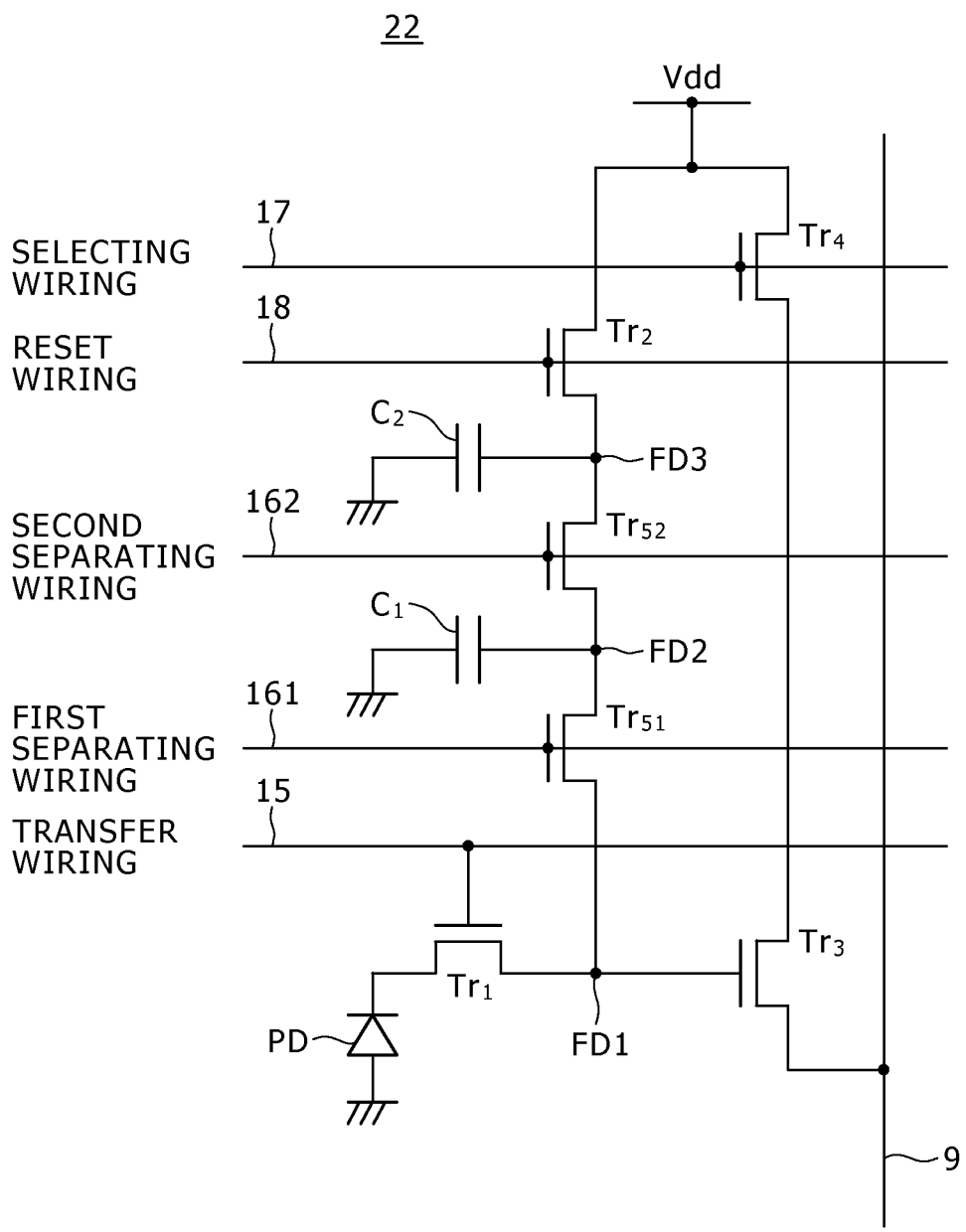
FIG. 11 is an equivalent circuit diagram of a pixel representing a fourth embodiment of a solid-state imaging device according to the present technology.

A fourth embodiment of the solid-state imaging device according to the present technology will be described. The solid-state imaging device according to the fourth embodiment is formed with three floating diffusion sections arranged within a pixel. FIG. 11 shows an equivalent circuit of a pixel according to the fourth embodiment. The pixel 22 includes one photodiode PD, one transfer transistor Tr1, one reset transistor Tr2, one amplifying transistor Tr3, and one selecting transistor Tr4. Further, the pixel 22 includes two separating transistors Tr51 and Tr52 and three floating diffusion sections FD1, FD2, and FD3.

Specifically, the photodiode PD is connected to the first floating diffusion section FD1 via the transfer transistor Tr1. The first floating diffusion section FD1 is connected to the gate of the amplifying transistor Tr3, and is connected to the second floating diffusion section FD2 via the first separating transistor Tr51. The second floating diffusion section FD2 is connected to the third floating diffusion section FD3 via the second separating transistor Tr52. The third floating diffusion section FD3 is connected to the reset transistor Tr2. The drain of the reset transistor Tr2 is connected to a power supply Vdd. Capacitance elements C1 and C2 are connected between the second floating diffusion section FD2 and a ground and between the third floating diffusion section FD3 and the ground, respectively. The amplifying transistor Tr3 has a drain connected to the power supply Vdd via the selecting transistor Tr4, and has a source connected to a vertical signal line 9.

The gate of the transfer transistor Tr1 is connected to transfer wiring 15. The gate of the first separating transistor Tr51 and the gate of the second separating transistor Tr52 are connected to a first separating wiring 161 and second separating wiring 162, respectively. The gate of the reset transistor Tr2 is connected to the reset wiring 18. The gate of the selecting transistor Tr4 is connected to the selecting wiring 17.

Preferable conditions for the capacitances of the first, second, and third floating diffusion sections FD1, FD2, and FD3 will be shown in the following. The second floating diffusion section FD2 desirably has a capacitance about twice to 20 times that of the first floating diffusion section FD1. The third floating diffusion section FD3 desirably has a capacitance about twice to 20 times that of the second floating diffusion section FD2.

In the above-described pixel 22, when the selecting transistor Tr4 is in an on state, the amplifying transistor Tr3 outputs a signal corresponding to the potential of the first floating diffusion section FD1 to the vertical signal line 9. In addition, when the first separating transistor Tr51 is in an on state, the amplifying transistor Tr3 outputs a signal corresponding to the potential of the first and second floating diffusion sections FD1 and FD2 connected to each other to the vertical signal line 9. When the first separating transistor Tr51 and the second separating transistor Tr52 are in an on state, the amplifying transistor Tr3 outputs a signal corresponding to the potential of the first, second, and third floating diffusion sections FD1, FD2, and FD3 connected to each other to the vertical signal line 9. This vertical signal line 9 is connected to a column processing circuit as a subsequent stage circuit, as described above, and the signals output to the vertical signal line 9 are taken into the column processing circuit. The reset transistor Tr2 resets the first, second, and third floating diffusion sections FD1, FD2, and FD3 by discharging the charges of the first, second, and third floating diffusion sections FD1, FD2, and FD3 into the power supply Vdd, that is, power supply wiring.

The solid-state imaging device according to the present embodiment is configured to perform driving by a driving method to be described in the following. The constitution of other parts is similar to that of the first embodiment.

[Driving Method]

Figure 12:
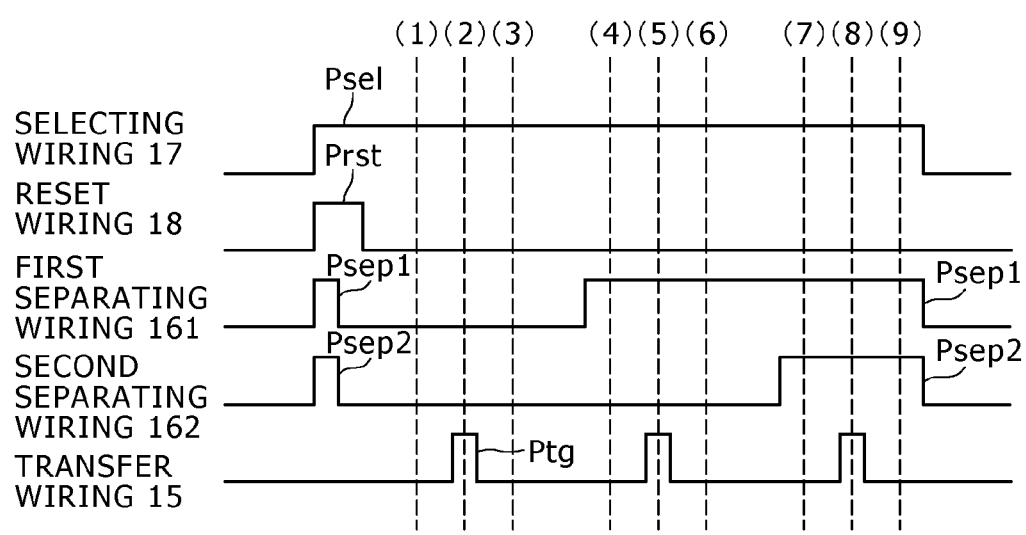
FIG. 12 is a driving timing waveform chart of the fourth embodiment.
Figure 13:
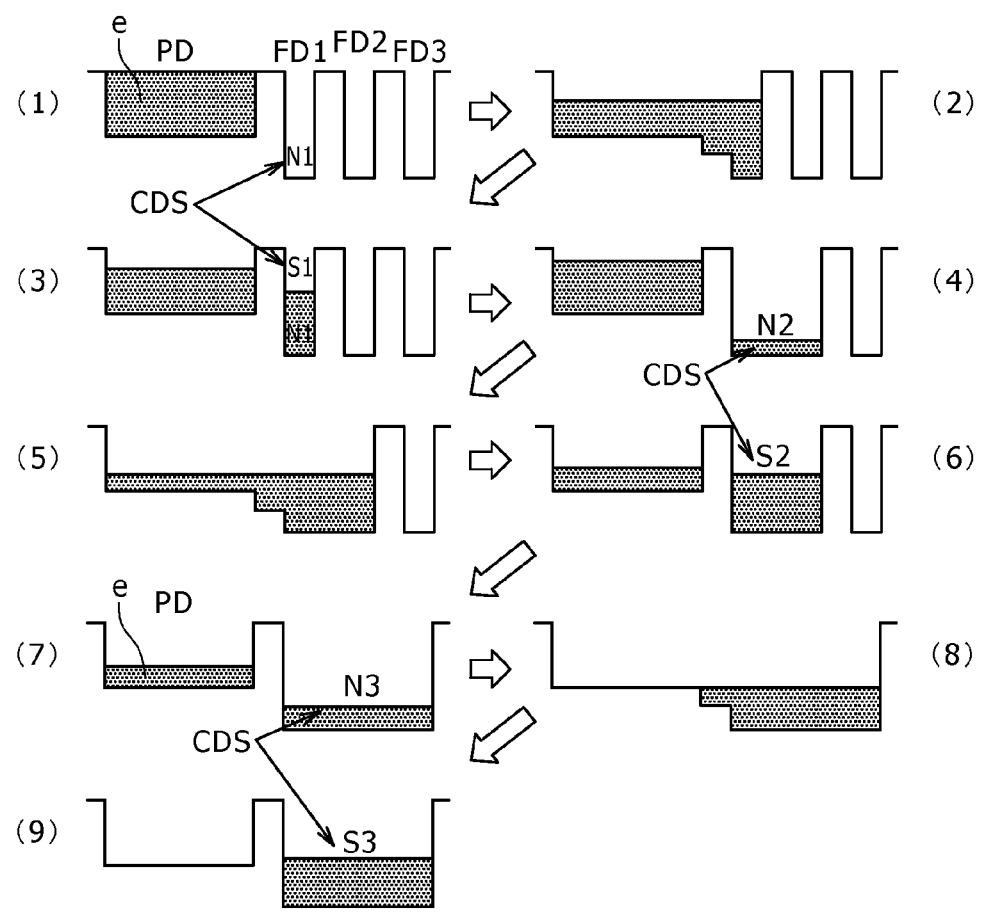
FIG. 13 is a diagram of potentials during the driving of the solid-state imaging device according to the fourth embodiment.
Figure 14:
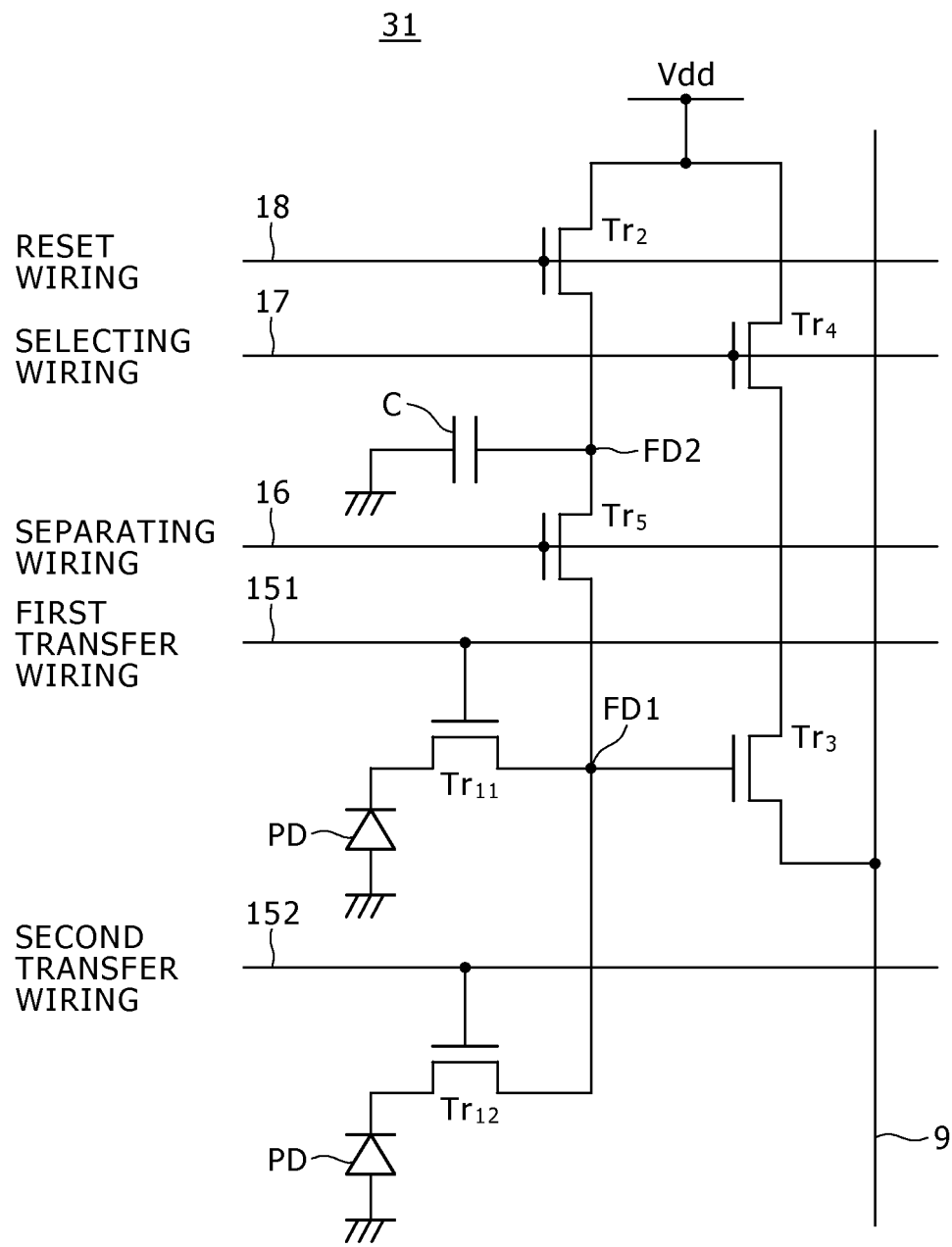
FIG. 14 is an equivalent circuit diagram of a pixel representing a fifth embodiment of a solid-state imaging device according to the present technology.

FIGS. 12 to 14 show the driving method of the solid-state imaging device according to the fourth embodiment. FIG. 12 shows driving timing when the pixel 22 is read. FIG. 13 shows potentials at the time of driving. The solid-state imaging device according to the present embodiment uses electrons as a signal charge. Suppose that a large amount of charge (electrons) e is accumulated in the photodiode PD before the pixel is read (see FIG. 13(1)).

As shown in FIG. 12, a selecting pulse Psel is applied through the selecting wiring 17 to turn on the selecting transistor Tr4, whereby the pixel is selected. In this state, a reset pulse Prst is applied via the reset wiring 18 to turn on the reset transistor Tr2. At the same time, a first separating pulse Psep1 and a second separating pulse Psep2 are applied via the first separating wiring 161 and the second separating wiring 162 to turn on the first separating transistor Tr51 and the second separating transistor Tr52, respectively. Thereby, the first, second, and third floating diffusion sections FD1, FD2, and FD3 are connected to each other, and the first, second, and third floating diffusion sections FD1, FD2, and FD3 are reset. The reset transistor Tr2 and the first and second separating transistors Tr51 and Tr52 are turned off, whereby a state at time point (1) in FIG. 12 and in FIG. 13(1) is obtained. The reset level signal of the first floating diffusion section FD1 which reset level signal is being output to the vertical signal line 9 through the amplifying transistor Tr3 at this time is taken as N1 into the column processing circuit.

Next, at time point (2) in FIG. 12, a transfer pulse Ptg is applied to the transfer transistor Tr1 through the transfer wiring 15 to turn on the transfer transistor Tr1, whereby the charge e is transferred from the photodiode PD to the first floating diffusion section FD1. At this time, when there is a large amount of charge e, the charge e also remains on the side of the photodiode PD (see FIG. 13(2)).

Next, as shown at time point (3) in FIG. 12, the transfer transistor Tr1 is turned off. At this time point (3), the charge e is stored in the first floating diffusion section FD1 (see FIG. 13(3)). The signal of the first floating diffusion section FD1 which signal is being output to the vertical signal line 9 through the amplifying transistor Tr3 at this time is taken as S1 into the column processing circuit.

The CDS processing of the column processing circuit provides a difference between the signal S1 obtained by superimposing a signal formed by the charge on the signal N1 and the signal N1, and thereby provides a first signal from which reset noise and the like are removed.

Next, as shown at time point (4) in FIG. 12, a first separating pulse Psep1 is applied through the first separating wiring 161 to turn on the first separating transistor Tr51, whereby the first and second floating diffusion sections FD1 and FD2 are connected to each other. The signal S1 of the first floating diffusion section FD1 is stored over the first and second floating diffusion sections FD1 and FD2 connected to each other (see FIG. 13(4)). The signal (signal of the first and second floating diffusion sections FD1 and FD2 connected to each other) being output to the vertical signal line 9 through the amplifying transistor Tr3 at this time is taken as N2 into the column processing circuit.

Next, as shown at time point (5) in FIG. 12, a transfer pulse Ptg is applied to turn on the transfer transistor Tr1, whereby the charge e of the photodiode PD is transferred to the first and second floating diffusion sections FD1 and FD2 connected to each other.

Next, at time point (6) in FIG. 12, the transfer transistor Tr1 is turned off. At this time point (6), the charge e is stored in the first and second floating diffusion sections FD1 and FD2 connected to each other (see FIG. 13(6)). The signal (signal of the first and second floating diffusion sections FD1 and FD2 connected to each other) being output to the vertical signal line 9 through the amplifying transistor Tr3 at this time is taken as S2 into the column processing circuit.

The CDS processing of the column processing circuit provides a difference between the signal S2 obtained by superimposing a signal formed by the charge on the signal N2 and the signal N2, and thereby provides a second signal from which reset noise and the like are removed.

Next, as shown at time point (7) in FIG. 12, with the first separating transistor Tr51 in the on state, a second separating pulse Psep2 is applied through the second separating wiring 162 to turn on the second separating transistor Tr52. Thereby, the first, second, and third floating diffusion sections FD1, FD2, and FD3 are connected to each other, and the signal S2 is stored over the first, second, and third floating diffusion sections FD1, FD2, and FD3 connected to each other (see FIG. 13(7)). The signal (signal of the first, second, and third floating diffusion sections FD1, FD2, and FD3 connected to each other) being output to the vertical signal line 9 through the amplifying transistor Tr3 at this time is taken as N3 into the column processing circuit.

Next, as shown at time point (8) in FIG. 12, a transfer pulse Ptg is applied to turn on the transfer transistor Tr1, whereby the charge e remaining in the photodiode PD is transferred to the first, second, and third floating diffusion sections FD1, FD2, and FD3 connected to each other.

Next, at time point (9) in FIG. 12, the transfer transistor Tr1 is turned off. At this time point (9), the charge e is stored in the first, second, and third floating diffusion sections FD1, FD2, and FD3 connected to each other (see FIG. 13(9)). The signal (signal of the first, second, and third floating diffusion sections FD1, FD2, and FD3 connected to each other) being output to the vertical signal line 9 through the amplifying transistor Tr3 at this time is taken as S3 into the column processing circuit.

The CDS processing of the column processing circuit provides a difference between the signal S3 obtained by superimposing a signal formed by the charge on the signal N3 and the signal N3, and thereby provides a third signal from which reset noise and the like are removed.

Next, the first signal, the second signal, and the third signal described above are added together with input converted gains made uniform in an output section.

In a case of a small signal, the first signal is used. In a case of a medium signal, a signal obtained by adding together the first signal and the second signal is used. In a case of a large signal, a signal obtained by adding together the first signal, the second signal, and the third signal is used. As in the above description, readout is performed three times in any of the cases of a small signal, a medium signal, and a large signal.

According to the solid-state imaging device and the driving method thereof according to the fourth embodiment, the floating diffusion section FD is divided into three floating diffusion sections FD1, FD2, and FD3. When a high-gain signal, a medium-gain signal, and a low-gain signal are output, each signal is output in order of a reset level signal to a signal obtained by superimposing a signal charge on the reset level signal. That is, the signals are output in order of N1, S1, N2, S2, N3 to S3. Thus, each signal can be subjected to CDS processing in the column processing circuit, so that reset noise and the like can be removed. Other effects as described in the first embodiment are produced.

[Example of Modification]

The solid-state imaging device including the pixel of FIG. 11 can adopt a driving method similar to that of the second embodiment. Specifically, after FIG. 13(3), the signal S1 is reset, and the first separating transistor Tr51 is turned on to connect the first and second floating diffusion sections FD1 and FD2 to each other. The signal N2 of the first and second floating diffusion sections FD1 and FD2 connected to each other without the signal S1 is taken into the column processing circuit. Next, the charge e of the photodiode PD is transferred to the first and second floating diffusion sections FD1 and FD2 connected to each other. The signal S2 of the first and second floating diffusion sections FD1 and FD2 connected to each other is taken into the column processing circuit to be subjected to CDS processing. Thereby a second signal as a difference between the signal S2 and the signal N2 is obtained.

Next, the signal S2 is reset, and thereafter the second separating transistor Tr52 is turned on to connect the first, second, and third floating diffusion sections FD1, FD2, and FD3 to each other. The signal N3 of the first, second, and third floating diffusion sections FD1, FD2, and FD3 connected to each other without the signal S2 is taken into the column processing circuit. Next, the charge e remaining in the photodiode PD is transferred to the first, second, and third floating diffusion sections FD1, FD2, and FD3 connected to each other. The signal S3 of the first, second, and third floating diffusion sections FD1, FD2, and FD3 connected to each other, to which sections the charge is transferred, is taken into the column processing circuit to be subjected to CDS processing. Thereby a third signal as a difference between the signal S3 and the signal N3 is obtained. Then, the output section adds together the first signal, the second signal, and the third signal with input converted gains made uniform.

According to the solid-state imaging device and the driving method thereof according to the present example of modification, the signals S1 and S2 are removed. It therefore suffices for the second and third floating diffusion sections FD2 and FD3 to have a low capacitance. In addition, for example, it suffices to design the output range of the vertical signal line to be narrow because the level of the signals N2 and N3 is constant each time. Thus, effects similar to those described in the second embodiment are obtained.

<6. Fifth Embodiment>

[Example of Configuration of Solid-State Imaging Device]

A fifth embodiment of the solid-state imaging device according to the present technology will be described. The solid-state imaging device according to the fifth embodiment includes pixels of a pixel sharing structure, or a two-pixel sharing structure in the present example. FIG. 14 shows an equivalent circuit of a pixel according to the fifth embodiment. The pixel 31 includes two photodiodes PD1 and PD2, two transfer transistors Tr11 and Tr12, one reset transistor Tr2, an amplifying transistor Tr3, and a selecting transistor Tr4, the reset transistor Tr2, the amplifying transistor Tr3, and the selecting transistor Tr4 being shared. Further, the pixel 31 includes two floating diffusion sections FD1 and FD2 and one separating transistor Tr5.

Specifically, the photodiodes PD1 and PD2 are connected to the first floating diffusion section FD1 via the first and second transfer transistors Tr11 and Tr12, respectively. The first floating diffusion section FD1 is connected to the gate of the amplifying transistor Tr3, and is connected to the second floating diffusion section FD2 via the separating transistor Tr5. The second floating diffusion section FD2 is connected to the reset transistor Tr2. The drain of the reset transistor Tr2 is connected to a power supply Vdd. A capacitance element C is connected between the second floating diffusion section FD2 and a ground. The amplifying transistor Tr3 has a drain connected to the power supply Vdd via the selecting transistor Tr4, and has a source connected to a vertical signal line 9.

The gate of the first transfer transistor Tr11 is connected to first transfer wiring 151. The gate of the second transfer transistor Tr12 is connected to second transfer wiring 152. The gate of the separating transistor Tr5 is connected to the separating wiring 16. The gate of the reset transistor Tr2 is connected to the reset wiring 18. The gate of the selecting transistor Tr4 is connected to the selecting wiring 17.

The solid-state imaging device according to the present embodiment is configured to perform driving by a driving method to be described in the following. The constitution of other parts is similar to that of the first embodiment.

[Driving Method]

Figure 15:
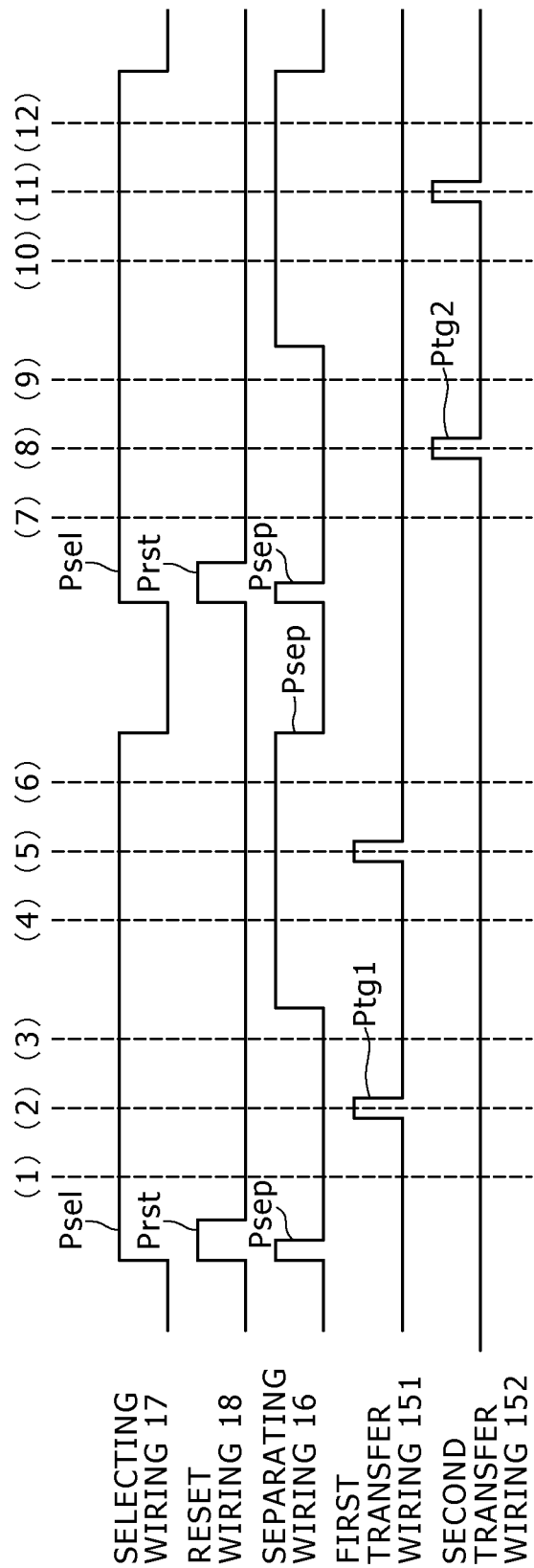
FIG. 15 is a driving timing waveform chart of the solid-state imaging device according to the fifth embodiment.

As shown in FIG. 15, a selecting pulse Psel is applied through the selecting wiring 17 to turn on the selecting transistor Tr4, whereby the pixel is selected. In this state, a reset pulse Prst is applied via the reset wiring 18 to turn on the reset transistor Tr2. At the same time, a separating pulse Psep is applied via the separating wiring 16 to turn on the separating transistor Tr5. Thereby, the first and second floating diffusion sections FD1 and FD2 are connected to each other, and the first and second floating diffusion sections FD1 and FD2 are reset.

The reset transistor Tr2 and the separating transistor Tr5 are turned off, whereby a state at time point (1) in FIG. 15 is obtained. The reset level signal of the first floating diffusion section FD1 which reset level signal is being output to the vertical signal line 9 through the amplifying transistor Tr3 at this time is taken as N1 into the column processing circuit.

Next, at time point (2) in FIG. 15, a first transfer pulse Ptg1 is applied to the first transfer transistor Tr11 through the first transfer wiring 151 to turn on the first transfer transistor Tr11. Thereby, a charge e from the first photodiode PD1 is transferred to the first floating diffusion section FD1. At this time, when there is a large amount of charge e, the charge e also remains on the side of the photodiode PD1.

Next, as shown at time point (3) in FIG. 15, the first transfer transistor Tr11 is turned off. At this time point (3), the charge e is stored in the first floating diffusion section FD1. The signal of the first floating diffusion section FD1 which signal is being output to the vertical signal line 9 through the amplifying transistor Tr3 at this time is taken as S1 into the column processing circuit.

The CDS processing of the column processing circuit provides a difference between the signal S1 obtained by superimposing a signal formed by the charge on the signal N1 and the signal N1, and thereby provides a first signal from which reset noise and the like are removed.

Next, as shown at time point (4) in FIG. 15, a separating pulse Psep is applied through the separating wiring 16 to turn on the separating transistor Tr5, whereby the first and second floating diffusion sections FD1 and FD2 are connected to each other. The signal S1 of the first floating diffusion section FD1 is stored over the first and second floating diffusion sections FD1 and FD2 connected to each other. The signal (signal of the first and second floating diffusion sections FD1 and FD2 connected to each other) being output to the vertical signal line 9 through the amplifying transistor Tr3 at this time is taken as N2 into the column processing circuit.

Next, as shown at time point (5) in FIG. 15, a first transfer pulse Ptg1 is applied to turn on the first transfer transistor Tr11, whereby the charge e of the first photodiode PD1 is transferred to the first and second floating diffusion sections FD1 and FD2 connected to each other.

Next, at time point (6) in FIG. 15, the first transfer transistor Tr11 is turned off. At this time point (6), the charge e is stored in the first and second floating diffusion sections FD1 and FD2 connected to each other. The signal (signal of the first and second floating diffusion sections FD1 and FD2 connected to each other) being output to the vertical signal line 9 through the amplifying transistor Tr3 at this time is taken as S2 into the column processing circuit.

The CDS processing of the column processing circuit provides a difference between the signal S2 obtained by superimposing a signal formed by the charge on the signal N2 and the signal N2, and thereby provides a second signal from which reset noise and the like are removed.

Next, the first signal and the second signal described above are added together with input converted gains made uniform in an output section.

Next, at time points (7) to (12) in FIG. 15, a signal formed by a charge e from the second photodiode PD2 is read. The charge e of the second photodiode PD2 is transferred to the first and second floating diffusion sections FD1 and FD2 with the second transfer transistor Tr12 on. Driving from time point (7) to time point (12) is a repetition of a period from time point (1) to time point (6) in the preceding stage, and therefore repeated description thereof will be omitted. The signals of the two pixels are thus read out.

The solid-state imaging device and the driving method thereof according to the fifth embodiment also produce similar effects to those described in the first embodiment.

In the above examples, the floating diffusion section FD is divided into two or three parts. However, the floating diffusion section FD can be divided into more parts, and readout can be performed four times or more until no charge remains in the photodiode.

A solid-state imaging device according to an embodiment of the present technology is applicable to devices in general that detect not only visible light but also physical quantities such as X-rays, particle fluxes, and the like by conversion thereof into amounts of charge.

<7. Sixth Embodiment>
[Example of Configuration of Electronic Device]

A solid-state imaging device according to an embodiment of the present technology is applicable to electronic devices such as cameras including a solid-state imaging device, portable devices provided with a camera, and other devices including a solid-state imaging device.

An electronic device according to a present embodiment includes, as a basic configuration, a solid-state imaging device, an optical system for guiding incident light to the solid-state imaging device, and a signal processing circuit for processing an output signal of the solid-state imaging device. A solid-state imaging device according to one of the embodiments described above is used as the solid-state imaging device.

FIG. 16 shows an embodiment in which the present technology is applied to a camera as an example of an electronic device. The camera 41 according to the present embodiment includes an optical lens group (optical system) 42, a solid-state imaging device 43, a DSP (Digital Signal Processor) 44, a frame memory 45, and a central processing unit (CPU) 46. The camera 41 further includes a display device 47, a recording device 48, an operating system 49, a power supply system 50, and the like. Of these parts, the DSP 44, the frame memory 45, the CPU 46, the display device 47, the recording device 48, the operating system 49, and the power supply system 50 are connected to a common bus line 51.

The optical lens group 42 is to guide image light (incident light) from a subject to an imaging surface (pixel array section: a pixel section) of the solid-state imaging device 43. A solid-state imaging device according to one of the foregoing embodiments is applied as the solid-state imaging device 43. The solid-state imaging device 43 converts the image light formed on the imaging surface by the optical lens group 42 into electric signals in pixel units. The DSP 44 is to control the solid-state imaging device 43 as well as to receive the signals from the solid-state imaging device 43 and generate an image signal. The frame memory 45 is a memory used to temporarily store the image signal processed by the DSP 44.

The display device 47 is to display the image signal output as a result of the processing of the DSP 44. The recording device 48 is to record the image signal on a magnetic tape, a magnetic disk, or an optical disk, for example. The operating system 49 is to operate the camera. The power supply system 50 is to apply power for driving the solid-state imaging device 43. The CPU 46 is to control the operation of these parts.

The present technology can take the form of a camera module in which the optical lens group 42, the solid-state imaging device 43, the DSP 44, the CPU 46, the frame memory 45, the power supply system 50, and the like are modularized.

The present technology makes it possible to configure a portable device provided with a camera including such a camera module, which portable device is typified by a mobile phone, for example.

Further, the present technology can be formed as a module having a modularized imaging function as described above, or a so-called imaging function module. The present technology makes it possible to configure an electronic device including such an imaging function module.

According to the electronic device 41 such as a camera or the like according to the sixth embodiment, the solid-state imaging device includes pixels each having a plurality of floating diffusion sections, and a column circuit can remove reset noise from both a small signal and a large signal in such manners as to correspond to the small signal and the large signal. Thus, image quality can be improved, and high-quality electronic devices can be provided. High-quality cameras can be provided.

The present disclosure contains subject matter related to that disclosed in Japanese Priority Patent Application JP 2010-264870 filed in the Japan Patent Office on Nov. 29, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising a pixel region in which a plurality of pixels are arranged, the pixels each including:
   (a) a photoelectric converter;
   (b) a transfer transistor;
   (c) a plurality of floating diffusions that receive a charge from the photoelectric converter through the transfer transistor, a first one of the floating diffusions being the first in line to receive the charge from the photoelectric converter;
   (d) a reset transistor that resets the floating diffusions;
   (e) between each floating diffusion and a subsequent floating diffusion, as viewed from the photoelectric converter, a separating transistor that makes or breaks a connection between them; and
   (f) an amplifying transistor that outputs a signal corresponding to a potential of at least one of the floating diffusions and that has an input directly connected to the first floating diffusion.

2. The solid-state imaging device according to claim 1, wherein the floating diffusion in a first stage, as viewed from the photoelectric converter, is reset via the reset transistor, and an output of the floating diffusion in the first stage is taken in by a subsequent stage circuit.

3. The solid-state imaging device according to claim 2, wherein a charge transferred from the photoelectric converter through the transfer transistor to the floating diffusion in the first stage, and an output of the floating diffusion in the first stage, with the floating diffusion in the first stage including the charge, is taken in by the subsequent stage circuit.

4. The solid-state imaging device according to claim 3, wherein, when the separating transistor is turned on and connects the floating diffusion in the first stage and a floating diffusion in a second stage as viewed from the photoelectric converter, an output of the floating diffusions connected to each other is taken in by the subsequent stage circuit.

5. The solid-state imaging device according to claim 4, wherein a charge transferred from the photoelectric converter through the transfer transistor to the floating diffusions connected to each other, an output of the floating diffusions connected to each other, with the floating diffusions connected to each other including the charge, is taken in by the subsequent stage circuit.

6. A solid-state imaging device comprising a pixel region in which a plurality of pixels are arranged, the pixels each including:
   (a) a photoelectric converter;
   (b) a transfer transistor;
   (c) a plurality of floating diffusions that receive a charge from the photoelectric converter through the transfer transistor, a first one of the floating diffusions being the first in line to receive the charge from the photoelectric converter;
   (d) a reset transistor that resets the floating diffusions;
   (e) between each floating diffusion and a subsequent floating diffusion, as viewed from the photoelectric converter, a separating transistor that makes or breaks a connection between them; and
   (f) an amplifying transistor that outputs a signal corresponding to a potential of at least one of the floating diffusions and that has an input directly connected to the first floating diffusion,
   wherein,
      the floating diffusion, in a first stage, as viewed from the photoelectric converter, is reset via the reset transistor, and an output of the floating diffusion in the first stage is taken in by a subsequent stage circuit,
      a charge transferred from the photoelectric converter through the transfer transistor to the floating diffusion in the first stage, and an output of the floating diffusion in the first stage, with the floating diffusion in the first stage including the charge, is taken in by the subsequent stage circuit,
      when the separating transistor is turned on and connects the floating diffusion in the first stage and a floating diffusion in a second stage, as viewed from the photoelectric converter, an output of the floating diffusions connected to each other is taken in by the subsequent stage circuit,
      a charge transferred from the photoelectric converter through the transfer transistor to the floating diffusions connected to each other, an output of the floating diffusions connected to each other, with the floating diffusions connected to each other including the charge, is taken in by the subsequent stage circuit,
      a difference between (a) the output of the floating diffusion in the first stage after the charge is transferred and (b) the output of the reset floating diffusion in the first stage and a difference between (a) the output of the floating diffusions connected to each other, the floating diffusions connected to each other including the charge transferred from the photoelectric converter, and (b) the output of the floating diffusions connected to each other before the charge is transferred, are obtained; and
      input converted gains of signals of the respective differences are made uniform, and the signals of the respective differences are added together.

7. The solid-state imaging device according to claim 1, wherein:
   the pixels are arranged in a form of a two-dimensional matrix, and
   the subsequent stage circuit is disposed so as to correspond to a column of the pixels.

8. The solid-state imaging device according to claim 1, wherein one pixel includes the two floating diffusions.

9. The solid-state imaging device according to claim 1, wherein:
   the output of the floating diffusions connected to each other, with the floating diffusions connected to each other including the charge of the floating diffusion in the first stage, is taken in by the subsequent stage circuit,
   the charge from the photoelectric converter transferred to the floating diffusions connected to each other without the floating diffusions connected to each other being reset, and the output of the floating diffusions connected to each other is taken in by the subsequent stage circuit, and
   a difference between both of these outputs taken in by the subsequent stage circuit is obtained.

10. The solid-state imaging device according to claim 1, wherein the floating diffusions connected to each other, with the floating diffusions connected to each other including the charge of the floating diffusion in the first stage, are reset before the output of the floating diffusions connected to each other, with the floating diffusions connected to each other including the charge transferred from the photoelectric converter, is taken in.

11. An electronic device comprising:
    a solid-state imaging device including a pixel region in which a plurality of pixels are arranged;

an optical system guiding incident light to a photoelectric converter of the solid-state imaging device; and a signal processing circuit processing an output signal of the solid-state imaging device, wherein, the pixels each include (a) a photoelectric converter, (b) a transfer transistor, (c) a plurality of floating diffusions receiving a charge from the photoelectric converter through the transfer transistor and having a first one of the floating diffusions being the first in line to receive the charge from the photoelectric converter, (d) a reset transistor that resets the floating diffusions, (e) between each floating diffusion and a subsequent floating diffusion, as viewed from the photoelectric converter, a separating transistor performing on-off control that makes or breaks a connection between them, and (f) an amplifying transistor that outputs a signal corresponding to a potential of at least one of the floating diffusions and that has an input directly connected to the first floating diffusion.

12. The electronic device according to claim 11, wherein the floating diffusion section in a first stage as viewed from the photoelectric converter is reset via the reset transistor, and an output of the floating diffusion in the first stage is taken in by a subsequent stage circuit.

13. The solid-state imaging device according to claim 12, wherein a charge transferred from the photoelectric converter through the transfer transistor to the floating diffusion in the first stage, and an output of the floating diffusion in the first stage, with the floating diffusion in the first stage including the charge, is taken in by the subsequent stage circuit.

14. The solid-state imaging device according to claim 13, wherein, when the separating transistor is turned on and connects the floating diffusion in the first stage and a floating diffusion in a second stage, as viewed from the photoelectric converter, an output of the floating diffusions connected to each other is taken in by the subsequent stage circuit.

15. The solid-state imaging device according to claim 14, wherein a charge transferred from the photoelectric converter through the transfer transistor to the floating diffusions connected to each other, an output of the floating diffusions connected to each other, with the floating diffusions connected to each other including the charge, is taken in by the subsequent stage circuit.

16. An electronic device comprising:

a solid-state imaging device including a pixel region in which a plurality of pixels are arranged;

an optical system guiding incident light to a photoelectric converter of the solid-state imaging device; and a signal processing circuit processing an output signal of the solid-state imaging device, wherein, the pixels each include (a) a photoelectric converter, (b) a transfer transistor, (c) a plurality of floating diffusions receiving a charge from the photoelectric converter through the transfer transistor and having a first one of the floating diffusions being the first in line to receive the charge from the photoelectric converter, (d) a reset transistor that resets the floating diffusions, (e) between each floating diffusion and a subsequent floating diffusion, as viewed from the photoelectric converter, a separating transistor performing on-off control that makes or breaks a connection between them, and (f) an amplifying transistor that outputs a signal corresponding to a potential of at least one of the floating diffusions and that has an input directly connected to the first floating diffusion, the floating diffusion in a first stage as viewed from the photoelectric converter is reset via the reset transistor, and an output of the floating diffusion in the first stage is taken in by a subsequent stage circuit, a charge transferred from the photoelectric converter through the transfer transistor to the floating diffusion in the first stage, and an output of the floating diffusion in the first stage, with the floating diffusion in the first stage including the charge, is taken in by the subsequent stage circuit, when the separating transistor is turned on and connects the floating diffusion in the first stage and a floating diffusion in a second stage, as viewed from the photoelectric converter, an output of the floating diffusions connected to each other is taken in by the subsequent stage circuit, a charge transferred from the photoelectric converter through the transfer transistor to the floating diffusions connected to each other, an output of the floating diffusions connected to each other, with the floating diffusions connected to each other including the charge, is taken in by the subsequent stage circuit, a difference between (a) the output of the floating diffusion in the first stage after the charge is transferred and (b) the output of the reset floating diffusion in the first stage and a difference between (a) the output of the floating diffusions connected to each other, the floating diffusions connected to each other including the charge transferred from the photoelectric converter, and (b) the output of the floating diffusions connected to each other before the charge is transferred, are obtained; and input converted gains of signals of the respective differences are made uniform, and the signals of the respective differences are added together.

17. The solid-state imaging device according to claim 11, wherein:

the pixels are arranged in a form of a two-dimensional matrix, and the subsequent stage circuit is disposed so as to correspond to a column of the pixels.

18. The solid-state imaging device according to claim 11, wherein one pixel includes the two floating diffusions.

19. The solid-state imaging device according to claim 11, wherein:

the output of the floating diffusions connected to each other, with the floating diffusions connected to each other including the charge of the floating diffusion in the first stage, is taken in by the subsequent stage circuit, the charge from the photoelectric converter transferred to the floating diffusions connected to each other without the floating diffusions connected to each other being reset, and the output of the floating diffusions connected to each other is taken in by the subsequent stage circuit, and a difference between both of these outputs taken in by the subsequent stage circuit is obtained.

20. The solid-state imaging device according to claim 11, wherein the floating diffusions connected to each other, with the floating diffusions connected to each other including the charge of the floating diffusion in the first stage, are reset before the output of the floating diffusions connected to each other, with the floating diffusions connected to each other including the charge transferred from the photoelectric converter, is taken in.

21. The solid-state imaging device of claim 1, further comprising a capacitive element coupled to a second in line floating diffusion, as viewed from the photoelectric converter.

22. The solid-state imaging device of claim 1, further comprising a respective capacitive element coupled to each subsequent in line floating diffusion, as viewed from the photoelectric converter.

23. The electronic device of claim 11, further comprising a capacitive element coupled to a second in line floating diffusion, as viewed from the photoelectric converter.

24. The solid-state imaging device of claim 1, further comprising a respective capacitive element coupled to each subsequent in line floating diffusion, as viewed from the photoelectric converter.

* * * * *